United States Patent
Cheng et al.

(10) Patent No.: US 10,615,166 B2
(45) Date of Patent: Apr. 7, 2020

(54) PROGRAMMABLE DEVICE COMPATIBLE WITH VERTICAL TRANSISTOR FLOW

(71) Applicant: International Business Machines Corporation, Armonk, NY (US)

(72) Inventors: Kangguo Cheng, Schenectady, NY (US); Juntao Li, Albany, NY (US); Geng Wang, Stormville, NY (US); Qintao Zhang, Mt Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/846,574

(22) Filed: Dec. 19, 2017

(65) Prior Publication Data

US 2019/0189625 A1 Jun. 20, 2019

(51) Int. Cl.
| | |
|---|---|
| *H01L 27/112* | (2006.01) |
| *H01L 29/423* | (2006.01) |
| *H01L 29/66* | (2006.01) |
| H01L 29/78 | (2006.01) |
| H01L 29/51 | (2006.01) |

(52) U.S. Cl.
CPC .. *H01L 27/11206* (2013.01); *H01L 27/11273* (2013.01); *H01L 29/42364* (2013.01); *H01L 29/66666* (2013.01); *H01L 29/513* (2013.01); *H01L 29/7827* (2013.01)

(58) Field of Classification Search
None
See application file for complete search history.

(56) References Cited

U.S. PATENT DOCUMENTS

| | | |
|---|---|---|
| 6,518,614 B1 | 2/2003 | Breitwisch et al. |
| 7,609,539 B2 | 10/2009 | Peng et al. |
| 7,907,465 B2 | 3/2011 | Peng et al. |
| 8,395,923 B2 | 3/2013 | Chen et al. |
| 8,471,355 B2 | 6/2013 | Kurjanowicz |
| 8,773,881 B2 | 7/2014 | Shepard |

(Continued)

FOREIGN PATENT DOCUMENTS

| | | |
|---|---|---|
| EP | 1743380 B1 | 12/2016 |
| EP | 3139408 A1 | 3/2017 |

OTHER PUBLICATIONS

"One-Time Programmable Vertical Field-Effect Transistor," unpublished U.S. Appl. No. 15/822,557, filed Nov. 27, 2017, International Business Machines Corporation.

*Primary Examiner* — Anthony Ho
*Assistant Examiner* — Kevin Quinto
(74) *Attorney, Agent, or Firm* — Amin, Turocy & Watson, LLP

(57) ABSTRACT

The present disclosure relates to a programmable device. The programmable device comprises a first vertical transistor; and a second vertical transistor coupled to the first vertical transistor via a shared terminal, wherein: a first gate dielectric of the first vertical transistor has a first thickness and a second gate dielectric of the second vertical transistor has a second thickness, the first thickness being greater than the second thickness, and the second gate dielectric breaks down based on an application of a gate voltage that is lower than a first breakdown voltage of the first gate dielectric and higher than a second breakdown voltage of the second gate dielectric.

16 Claims, 22 Drawing Sheets

(56) References Cited

U.S. PATENT DOCUMENTS

| | | |
|---|---|---|
| 8,933,492 B2 | 1/2015 | Kurjanowicz |
| 9,129,687 B2 | 9/2015 | Kurjanowicz |
| 9,368,572 B1 | 6/2016 | Cheng et al. |
| 9,589,970 B1 | 3/2017 | Tseng |
| 2001/0028093 A1* | 10/2001 | Yamazaki ......... H01L 21/02071 257/412 |
| 2002/0060338 A1* | 5/2002 | Zhang ............... H01L 29/66545 257/328 |
| 2015/0028411 A1* | 1/2015 | Lee .................... H01L 29/7827 257/330 |

* cited by examiner device binary states "0" verus "1"

Logic "1"

Thinner gate dielectric breaks down, shorting WL to bottom drain.

$I_{BL} >> 0$

Logic "0"

No gate dielectric breakdown.
No current flows to BL because of floating drain $I_{BL} = 0$

PROGRAMMABLE DEVICE COMPATIBLE WITH VERTICAL TRANSISTOR FLOW

BACKGROUND

The subject disclosure relates to semiconductor device structures and assembly, and more specifically, to vertical transistor cell devices and the manufacturing thereof.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later.

According to other example embodiments, a programmable device is provided. The device, which can be a one-time programmable device, can comprise a first vertical transistor (e.g., VFET) and a second vertical transistor coupled to the first vertical transistor is coupled with the second vertical transistor via a shared terminal. In some example embodiments, the shared terminal comprises a shared bottom drain. In other example embodiments, the shared terminal can comprise a bottom source. A first gate dielectric of the first vertical transistor has a first thickness and a second gate dielectric of the second vertical transistor has a second thickness, the first thickness being greater than the second thickness. The second gate dielectric breaks down based on an application of a gate voltage that is lower than a first breakdown voltage of the first gate dielectric and higher than a second breakdown voltage of the second gate dielectric. In example embodiments, the first gate dielectric can comprise first dielectric layer and a second dielectric layer. In example embodiments, the second gate dielectric can comprise, for example, a high-k dielectric. In example embodiments, the first vertical transistor can comprise a first fin and the first gate dielectric can be coupled to the first fin. In example embodiments, the second vertical transistor can comprise a second fin and the second gate dielectric can be coupled to the second fin. The first vertical transistor can comprise a top terminal situated above the first fin. Optionally, the second vertical transistor can comprise a second top terminal situated above the second fin. The device can further comprise a metal gate in contact with the first gate dielectric and the second gate dielectric.

According to other example embodiments, a method is provided. The method can comprise forming a first fin of a first vertical transistor (e.g., VFET) and a second fin of a second vertical transistor on a substrate, wherein the first vertical transistor and the second vertical transistor are coupled via a common terminal, forming in part a programmable cell. In some example embodiments, the common terminal can comprise a drain (e.g., a common bottom drain). In other example embodiments, the common terminal can comprise a source (e.g., a common bottom source). The method can comprise coating the first fin and the second fin with a first dielectric layer. The method can comprise covering the first fin coated by the first dielectric layer with a protective mask. The method can comprise removing a portion of the first dielectric layer coating the second fin. The method can comprise removing the protective mask. The method can comprise forming a second dielectric layer onto the first dielectric layer coating the first fin and onto the second fin, wherein the first dielectric layer and the second dielectric layer associated with the first fin comprise a first gate dielectric, and the second dielectric layer coating the second fin comprises a second gate dielectric. The programmable cell can be selected for programming using a row selection circuit and a column selection circuit. The method can further comprise forming a metal gate in contact with the first gate dielectric and the second gate dielectric. The method can further comprise forming a first top terminal (e.g., a top source, or a top drain) above the first fin. The method can optionally comprise forming a second top terminal (e.g., a top source, or a top drain) above the second fin. The method can also comprise programming the programmable cell by applying a gate voltage that is lower than a first breakdown voltage of the first gate dielectric and higher than a second breakdown voltage of the second gate dielectric.

According to example embodiments, a method is provided. The method can comprise forming a first vertical transistor (e.g., VFET) and a second vertical transistor, wherein the first vertical transistor is coupled to the second vertical transistor via a shared terminal (e.g., a shared bottom drain, or a shared bottom source), wherein: the first vertical transistor comprises a first gate dielectric, the second vertical transistor comprises a second gate dielectric, and the first gate dielectric is thicker than the second gate dielectric. The first gate dielectric can comprise a first dielectric layer and a second dielectric layer. The second gate dielectric can comprise the second dielectric layer. The method can further comprise forming a metal gate around the dielectric layer. The first vertical transistor can comprise a top terminal (e.g., a top source, or a top drain) formed above a first fin of the first vertical transistor. Optionally, the second vertical transistor can comprise a top terminal (e.g., top source, or top drain) formed above a second fin of the second vertical transistor. The method can comprise facilitating the breakdown of the second gate dielectric by applying a gate voltage that is lower than a first breakdown voltage of the first gate dielectric and higher than a second breakdown voltage of the second gate dielectric.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Vertical transistors (e.g., vertical field effect transistors, or VFETs) are a potential device option to continue scaling complementary metal-oxide-semiconductor (CMOS) technology to five nanometer (5 nm) nodes, and beyond. One-time-programmable (OTP) devices have a variety of applications including chip identification, on-chip memory, etc. Described herein are one or more example embodiments of an on-chip OTP vertical transistor device, and more particularly a one-time programmable device that comprises two vertical transistors with a shared bottom drain. Furthermore, one vertical transistor has a gate dielectric that is thinner than the gate dielectric of the other vertical transistor. As mentioned above, for simplicity, the device will also be referred to herein as the OTP cell.

In example embodiments, the OTP cell can comprise a first vertical transistor and a second vertical transistor, wherein the first vertical transistor is coupled with the second vertical transistor (e.g., coupled via a shared source/drain, wherein the source and drain are interchangeable in typical field effect transistor implementations, via a drain region of a substrate, via a substrate, etc.). A first gate dielectric of the first vertical transistor has a first thickness and a second gate dielectric of the second vertical transistor has a second thickness, the first thickness being greater than the second thickness. The first gate dielectric can comprise a first dielectric layer and a second dielectric layer, and the second gate dielectric can comprise the second dielectric layer. The first vertical transistor can comprise a first fin, and the first gate dielectric can be coupled to the first fin (e.g., formed, deposited, layered, coated, etc.). The second vertical transistor can comprise a second fin and the second gate dielectric can be coupled to the second fin. The first vertical transistor can comprise a top source situated above the first fin. Optionally, the second vertical transistor can comprise a second top source situated above the second fin. The OTP cell can further comprise a metal gate in contact with the first gate dielectric and the second gate dielectric.

Figure 1:
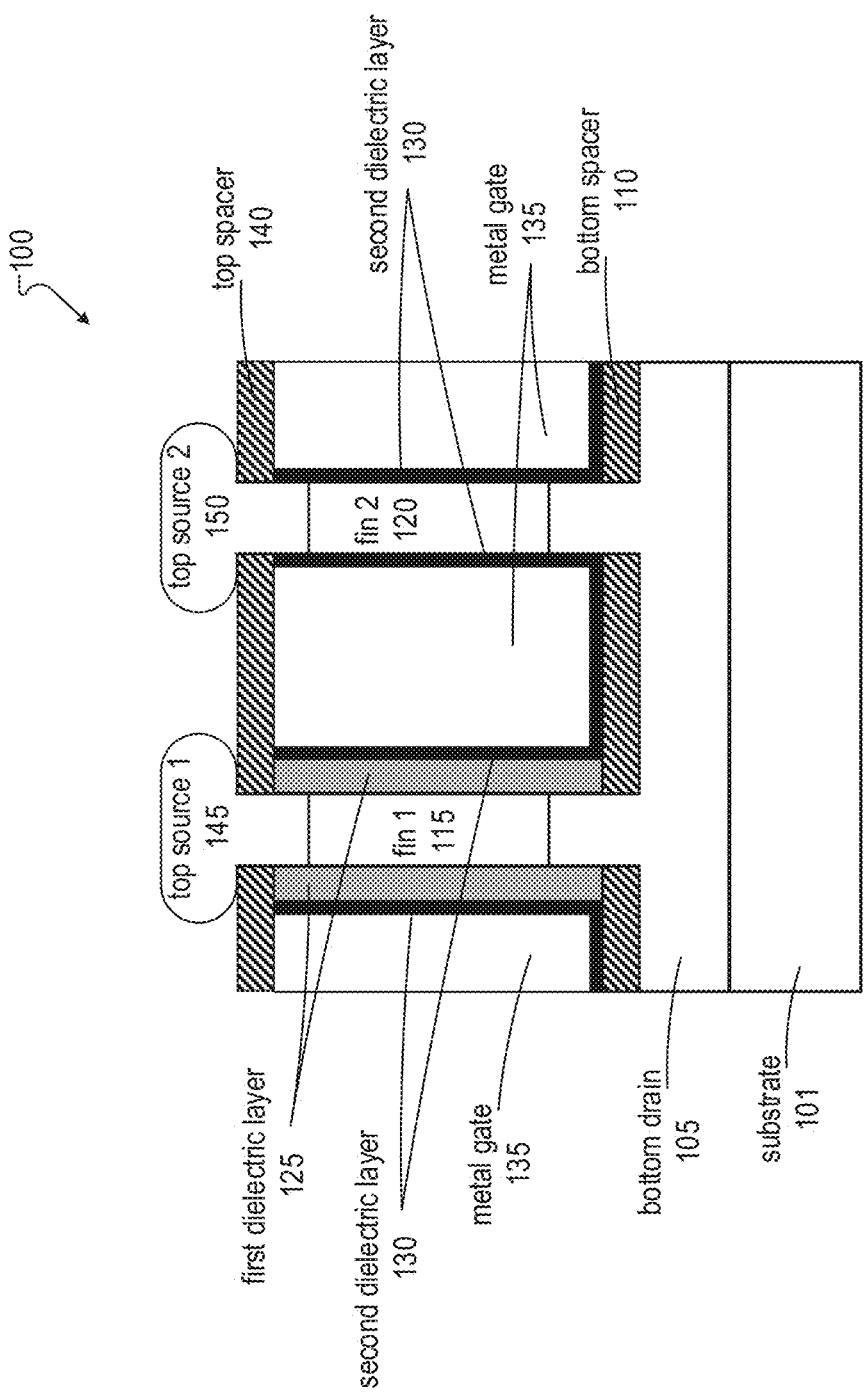
FIG. 1 illustrates a cross sectional view of an example, non-limiting device, the device being a one-time programmable (OTP) cell comprising a first vertical transistor (e.g., a vertical field effect transistor, or VFET) having a gate dielectric thicker than a gate dielectric of a second vertical transistor, in accordance with one or more embodiments described herein. The device, example embodiments of which will be described below, is referred to herein, for simplicity purposes, as "OTP cell."

With reference now to FIG. 1, an example embodiment of a OTP cell 100 in accordance with one or more example embodiments is shown in a cross-sectional view of the device. Note that while figures in this disclosure have different regions shaded (or patterned) for contrast, similar shaded or non-shaded (or patterned or un-patterned) regions does not necessarily imply that the same materials are for used for the components those shaded regions represent. The OTP cell can comprise a first vertical transistor and a second vertical transistor, wherein the first vertical transistor is coupled with the second field effect transistor, and a first gate dielectric of the first vertical transistor is thicker than a second gate dielectric of the second field effect transistor. Put another way, a first gate dielectric of the first vertical transistor has a first thickness and a second gate dielectric of the second vertical transistor has a second thickness, the first thickness being greater than the second thickness.

The OTP cell can comprise a substrate 101. A shared terminal, such as bottom drain 105, can be situated in or above the substrate 101. The drain can be formed by doping a portion of the substrate. The drain can also be formed by epitaxially growing an additional material on top of the substrate, and thus be coupled to and in contact with the substrate 101. The first vertical transistor can be coupled to the second vertical transistor via the drain, such as the bottom drain 105. In some example embodiments, the bottom drain 105 can be considered a part of a doped region (p-doped or n-doped) of the substrate 101. In example embodiments, the source and drain can be considered to be interchangeable. Thus, in some example embodiments, the shared terminal can be a bottom drain, and in other examples, the terminal can be a bottom source.

A bottom spacer 110 can be situated above the bottom drain 105. A first vertical fin 115 (shown as fin 1 115 in FIG. 1) of the first vertical transistor and a second vertical fin 120 (shown as fin 2 120 in FIG. 1) of the second vertical transistor can extending upward from the bottom drain 105. The bottom spacer 110 layer can be situated below both the first vertical fin 115 and the second vertical fin 120.

The first vertical fin 115 can have a first dielectric layer 125. An additional, second dielectric layer 130, which can be, for example a high-k dielectric (e.g., a dielectric material having a high dielectric constant k) can cover the first dielectric layer 125 of the first vertical transistor. The second dielectric layer 130 can also cover the walls of the second vertical fin 120 (e.g., fin of the second vertical transistor). The first dielectric layer 125 and the second dielectric layer 130 associated with the first vertical fin 115 can comprise a first gate dielectric of the first vertical transistor. The second dielectric layer 130 around the second vertical fin 120 can comprise a second gate dielectric of the second vertical transistor. As such, the first vertical transistor comprises a first vertical fin 115, and the first gate dielectric (e.g., the first dielectric layer 125 and the second dielectric layer 130 covering the first dielectric layer 125) is coupled to the first fin. Additionally, the second vertical transistor comprises a second vertical fin 120, and the second gate dielectric (e.g., the portion of the second dielectric layer covering the second vertical fin 120) is coupled to the second fin. Because the gate dielectric of the first vertical transistor comprises the first dielectric layer and the second dielectric layer, whereas the gate dielectric of the second vertical transistor comprises the second dielectric layer, the gate dielectric of the first vertical transistor is thicker than the gate dielectric of the second vertical transistor.

Still referring to FIG. 1, metal gate 135 (e.g., gate layer) can occupy the regions surrounding both of the fins and their respective gate dielectrics. A top spacer layer 140 can also be situated above both the first fin and the second fin. The first vertical transistor can also comprise a top source 145 (shown in FIG. 1 as top source 1 145) that is formed and situated above the first vertical fin 115. In second vertical transistor can also comprise a top source 150 (show in FIG. 1 as top source 2 150) situated above the second vertical fin 120. In example embodiments, the second top source is floating (does not connect to terminal contacts, such as a wordline or bitline.). In some example embodiments, the second vertical transistor does not have a top source 150 (e.g., as described below with respect to FIGS. 14-21). Further details, including some examples for various components, regarding the OTP cell, and its assembly, appear below.

Figure 2:
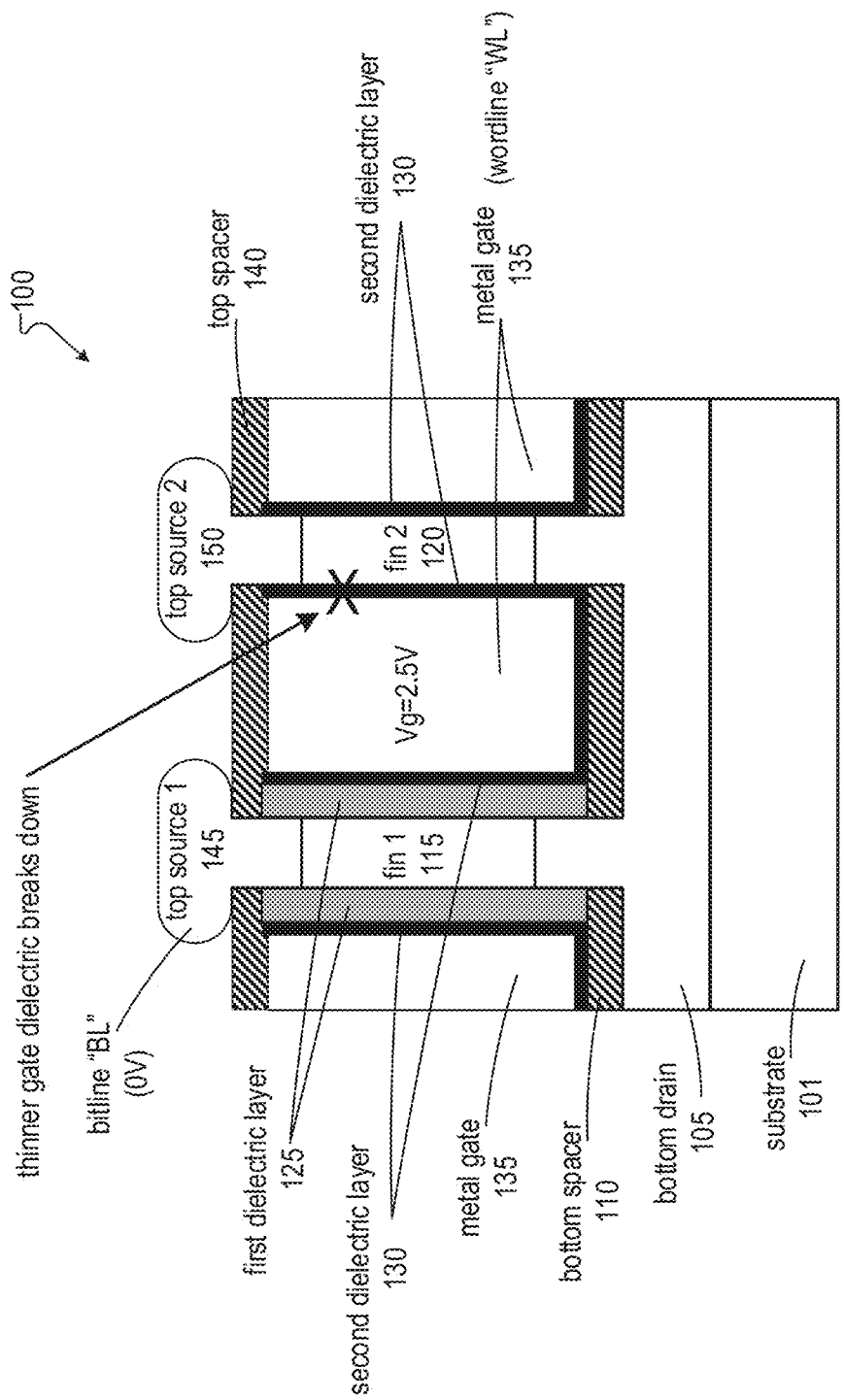
FIG. 2 illustrates a cross-sectional view of a OTP cell, wherein the gate dielectric of the second vertical transistor breaks down in response to an applied gate voltage, in accordance with one or more embodiments described herein.

FIG. 2 illustrates a cross-sectional view of a OTP cell, wherein the gate dielectric of the second vertical transistor (e.g., the thinner gate dielectric) breaks down in response to an applied gate voltage, in accordance with one or more embodiments described herein. In example embodiments, the second gate dielectric is operable to break down based on an application of a gate voltage that is higher than a breakdown voltage of the second gate dielectric and lower than the breakdown voltage of the first gate dielectric.

In example embodiments, top source 145 can serves as the bitline "BL", and the metal gate 135 serves as wordline "WL" (as shown in figures below (e.g., FIGS. 13, 18), the top source 145 can be in contact with a bitline trench, and the metal gate 135 can be in electrical contact with a wordline). To program the OTP cell, a gate voltage that is higher than the breakdown voltage of second vertical transistor (e.g., the vertical transistor having the thinner gate dielectric) but lower than the breakdown voltage of the first vertical transistor (e.g., the vertical transistor having the thicker gate dielectric) is applied. The thinner gate dielectric associated with the second vertical transistor (e.g., the second dielectric layer 130 covering the second vertical fin 120) breaks down when the gate voltage is applied, and the gate voltage shorts to the common (e.g., shared) drain. Thus, to read the OTP cell, a low gate voltage is applied. The BL is grounded. If the thin gate dielectric breaks down, the applied gate voltage shorts to the common drain (e.g., bottom drain 105) and current flows through the first vertical transistor having the thicker gate dielectric (e.g., Vds=Vgs; Vds is the voltage difference between source and drain. Vgs is the voltage difference between gate and source). If the thin gate dielectric is NOT broken down, no current flows in the transistor (e.g., first vertical transistor), as the bottom drain 105 is floating.

Still referring to FIG. 2, an example of the breakdown of the thinner gate dielectric (e.g., gate dielectric associated with the second vertical transistor) can be illustrated using assumed (or hypothetical) voltage values. If the gate dielectric associated with the first vertical transistor (e.g., the vertical transistor having the thicker gate dielectric) has a breakdown voltage of three volts (3V) and the gate dielectric associated with the second vertical transistor (e.g., the vertical transistor having the thinner gate dielectric) has a breakdown voltage of two volts (2V), then a gate voltage (e.g., voltage associated with the metal gate 135, wordline voltage, Vg) of 2.5 V, which is higher than the breakdown voltage of the thinner gate dielectric but lower than the breakdown voltage of the thicker gate dielectric, can be applied, which causes the thinner gate dielectric to break down at the gate-to-drain overlap region.

Figure 3B:
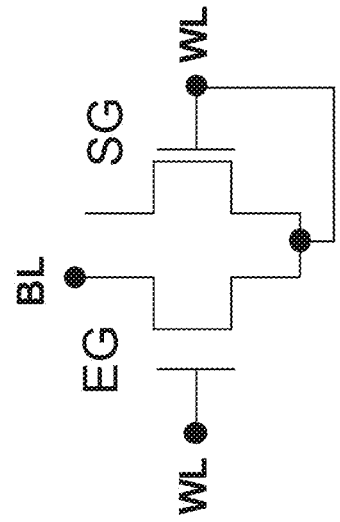
FIGS. 3A and 3B illustrates a circuit diagram showing the operation of the OTP cell, wherein a short is created between the gate of the device and the drain of the device, in accordance with one or more embodiments described herein.
Figure 3A:
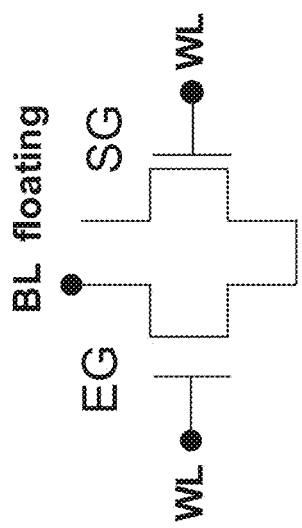

FIGS. 3A and 3B illustrate wiring diagrams showing the operation of the OTP cell, wherein a short is created between the gate of the device and the drain of the device when the thinner gate dielectric breaks down, in accordance with one or more embodiments described herein. The OTP cell can be operable to have two electrical states, a binary "0" state (logic "0") and a binary "1" state (logic "1").

In FIG. 3A, depicting a logic state of "0", when no voltage reaching the breakdown voltage of the thinner gate dielectric is applied, there is no dielectric breakdown of the thinner gate dielectric. As such, no current flows to the bitline (e.g., in example embodiments, the top source 145), wherein $I_{BL}$ represents the current flow to the bitline, $I_{BL}=0$. EG refers to the transistor with thicker gate dielectric. SG refers to the transistor with thinner gate dielectric.

In FIG. 3B, for the logic state "0," for the vertical transistor having the thicker gate dielectric (e.g., the vertical transistor having both the first dielectric layer 125 and the second dielectric layer 130), the voltage of the source (bitline) is equal to zero ($V_s=V_{BL}=0$). When breakdown of the thinner gate dielectric breaks down, the gate voltage (e.g., wordline voltage, voltage associated with the metal gate 135) would be the same as the voltage from the metal gate 135 to the top source 145 (which can also be referred to as the difference in voltage between the wordline and bitline), and thus: $V_{gs}=V_{WL}-V_{BL}=V_{WL}$. The voltage from the bottom drain 105 to the top source 145 would be equal to the gate voltage: $V_{ds}=V_{WL}$ (drain shorts to gate due to dielectric breakdown of the thinner gate dielectric). In the circuit diagram of FIG. 3B, the short from the metal gate (WL) to the drain is shown. Note that after the breakdown of the thinner gate dielectric, the current flow to the bitline, $I_{BL}$, is equivalent to the on-current of the EG transistor.

Figure 4:
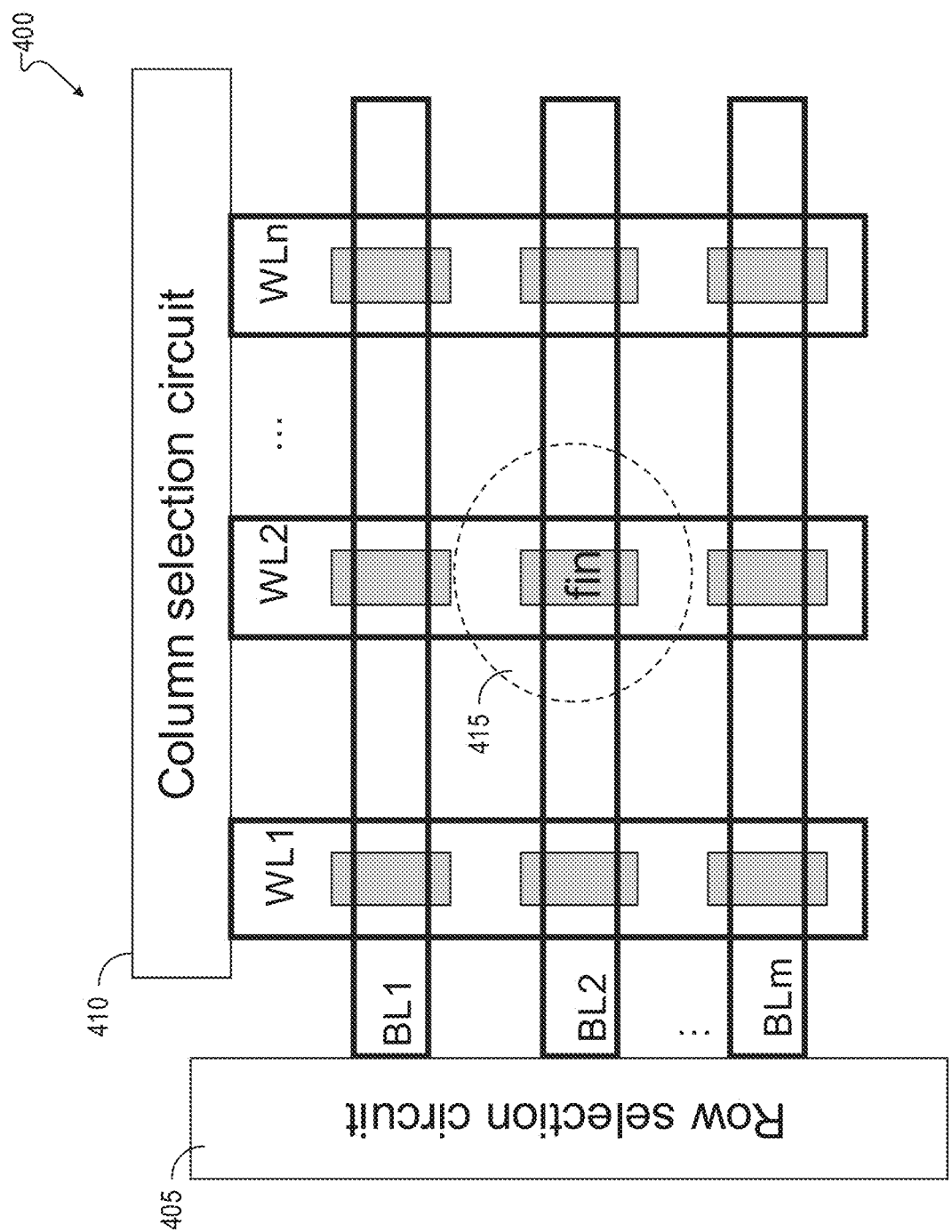
FIG. 4 illustrates an example circuit election mechanism that can be used to program OTP cells, in accordance with one or more embodiments described herein.

FIG. 4 illustrates an example circuit election mechanism 400 that can be used to program OTP cells in accordance with one or more embodiments described herein. In the example shown, OTP cells can be arranged in an array. Each individual OTP cell can be accessed (e.g., programmed/read) by a row selection circuit 405 (bitlines) and column selection circuit 410 (wordlines). For example, the OTP cell in the middle 415 (2,2) can be accessed by turning on WL2 ($2^{nd}$ column) and BL2 ($2^{nd}$ row).

FIGS. 5-18 depict various example stages associated with the assembly of an OTP cell in accordance with one or more example embodiments described herein.

Figure 5:
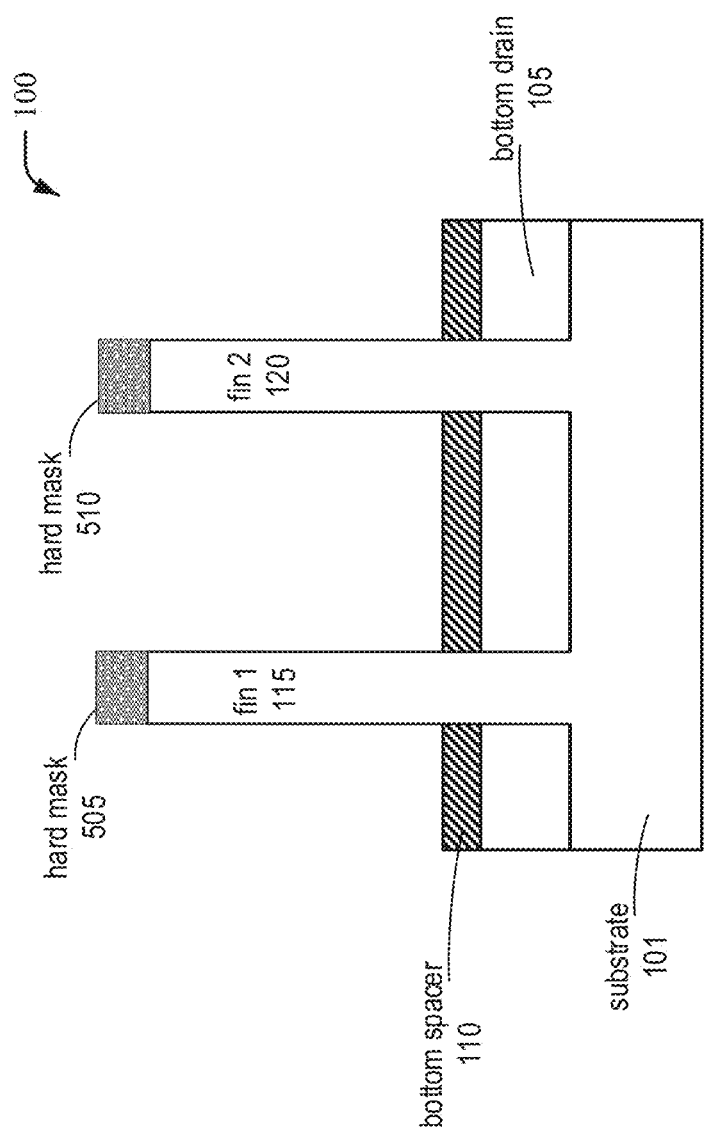
FIG. 5 illustrates a cross-sectional view showing a formation of the fins of the OTP cell, together with a substrate and drain regions, in accordance with one or more embodiments described herein.

FIG. 5 illustrates a cross-sectional view showing a formation of the fins of the OTP cell, together with a substrate and drain regions, in accordance with one or more embodiments described herein. A vertical transistor, such as a VFET device, can comprise a vertical fin that extends upward from the substrate. The fin forms the channel region of the transistor (e.g., fin channel). In example embodiments, each fin can be approximately 5-10 nanometers in width, and 15-50 nanometers in height. A source region and a drain region (see below) are situated in electrical contact with the top and bottom ends of the channel region, while a metal gate is disposed upon the fin sidewalls.

An example assembly can begin with a substrate (e.g., substrate 101). The substrate can be any suitable substrate, including but not limited to silicon, germanium, silicon germanium, silicon carbide, III-V compound semiconductors, II-VI compound semiconductors. The semiconductor substrate may also comprise an organic semiconductor or a layered semiconductor such as, for example, Si/SiGe, a silicon-on-insulator or a SiGe-on-insulator. A portion or entire semiconductor substrate may be amorphous, polycrystalline, or monocrystalline. The semiconductor substrate may be doped, undoped or contain doped regions and undoped regions therein. The semiconductor substrate may contain regions with strain and regions without strain therein, or contain regions of tensile strain and compressive strain. In some embodiments, the substrate 101 is a silicon substrate. Fins (e.g., first vertical fin 115, second vertical fin 120) can be formed extending vertically from the substrate. The fins can comprise, for example, a nanowire or a pillar. Fins can be formed by any suitable patterning techniques, including but not limited to, sidewall image transfer (SIT), self-aligned double patterning (SADP), self-aligned quadruple pattering (SAQP), lithography followed by directional etching, etc. Fin hard masks (e.g., hard mask 505, hard mask 510) on top of fins are used to facilitate device fabrication. The hard masks 505 and 510 can be comprised of, for example, silicon nitride, silicon oxynitride, silicon oxide, SiOC, SiOCN, SiBCN, SiCN, or any suitable combination of those materials, etc.

A shared terminal coupling the fins, such as a bottom drain (e.g., bottom drain 105) can also be formed (e.g., formed by epitaxy with in-situ doping). In example embodiments, the bottom drain 105 can be formed sequentially on the substrate via epitaxial growth (e.g., formed by epitaxy). The bottom drain 105 can be doped in situ. In example embodiments, epitaxial growth of the bottom drain 105 can be performed in a single integrated epitaxy process. Alternatively, any suitable doping technique (e.g., ion implantation, gas phase doping, plasma doping, plasma immersion ion implantation, cluster doping, infusion doping, liquid phase doping, solid phase doping, etc.) can be used to form the bottom drain 105. A bottom spacer (e.g., bottom spacer 110) layer can also be formed. In example embodiments, the bottom spacer 110 can be approximately 5-8 nanometers thick. Bottom spacer 110 can comprise a dielectric material such as silicon oxide, silicon nitride, silicon oxynitride, SiOC, SiOCN, SiBCN, SiCN, any suitable combination of these materials. The bottom spacers can be formed by any suitable technique (for example, by directional deposition). In other embodiments, the shared terminal can be a shared bottom source.

Although not shown, an isolation region (e.g., from shallow trench isolation) can be formed to isolate the OTP cell device from other devices. In some example embodiments (e.g., as shown in FIG. 1), the bottom drain 105 can be formed prior to the formation of the first vertical fin 115 and the second vertical fin 120. The bottom drain 105 can be formed, for example, by forming a doped layer/region in the substrate (as mentioned above, the doped region can be p-type or n-type), and then the first vertical fin 115, and second vertical fin 120 can be formed extending from the doped layer/region.

Figure 6:
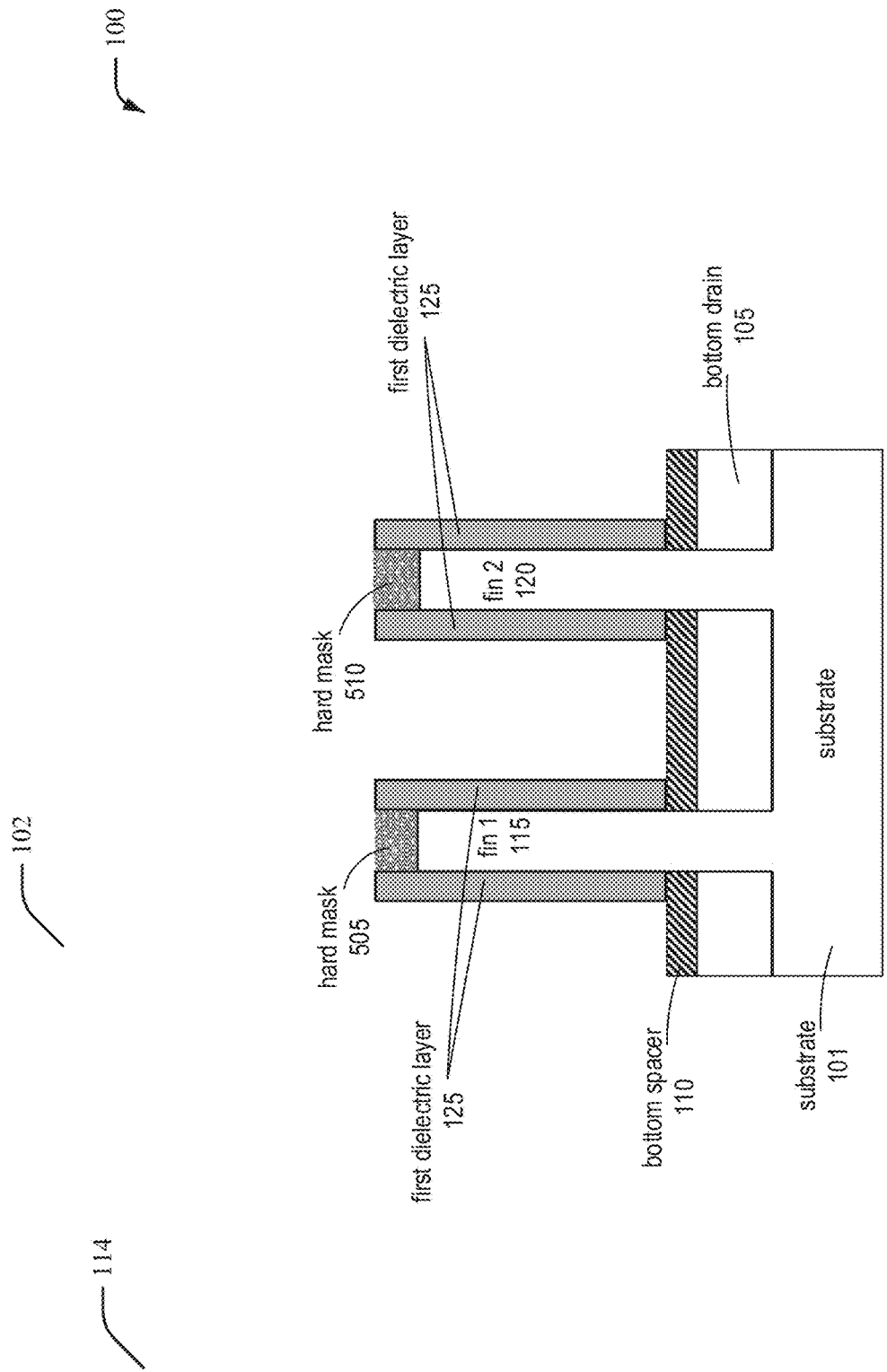
FIG. 6 illustrates a cross-sectional view showing the formation of a thick oxide around each fin of the OTP cell, in accordance with one or more embodiments described herein.

Moving on, FIG. 6 illustrates a cross-sectional view showing the formation of a first dielectric layer (e.g., first dielectric layer 125). Any dielectric material can be used here. For example, besides oxides such as silicon dioxide, nitrides (e.g., silicon nitride) can also be used. This layer can be used is to thicken the gate dielectric of the first VFET of the OTP cell, in accordance with one or more embodiments described herein. In example embodiments, the thickness of the first dielectric layer 125 can be approximately 3-5 nanometers. The first dielectric layer 125 can be formed by deposition or oxidation, followed by directional etching (e.g., using a reactive ion etch (RIE)). As a result, a first dielectric layer (e.g., first dielectric layer 125) can be formed on the first fin (e.g., first vertical fin 115). During application or coating of the first dielectric layer 125, the first dielectric layer 605 also forms on the second fin (e.g., second vertical fin 120), but, as described below, the portion of the first dielectric layer 125 that was formed on the second fin will be removed.

Figure 7:
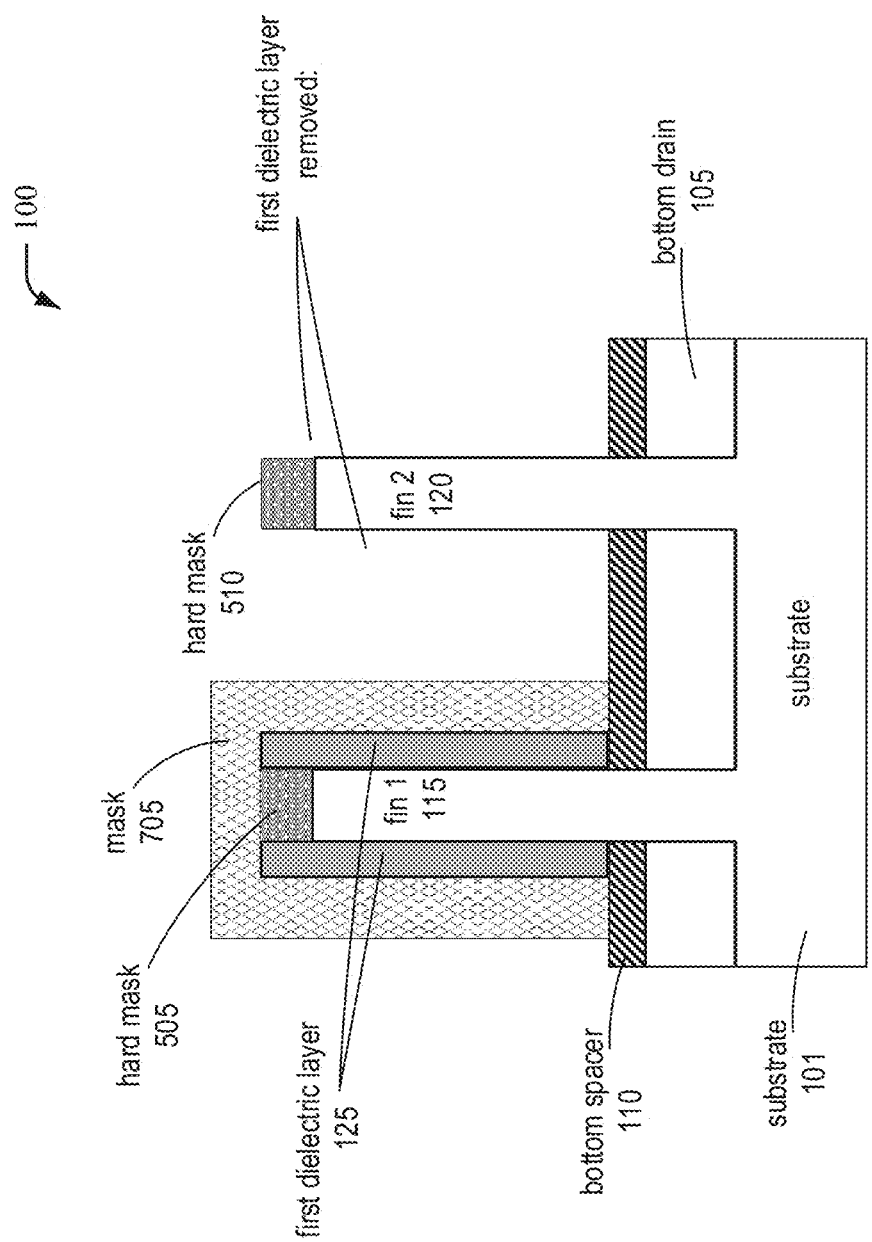
FIG. 7 illustrates a cross-sectional view showing the application of a mask to cover the thick oxide and one of the fins of the OTP cell, while exposing the thick oxide around the other fin, in accordance with one or more embodiments described herein.

FIG. 7 illustrates a cross-sectional view showing the application of a protective mask (e.g., mask 705) to cover the first dielectric layer 125, along with the first vertical fin 115, and hard mask 505. The mask 705 can be comprised of, for example, for example, a photoresist.

The portion of the first dielectric layer 125 that covers the second vertical fin 120, without a protective mask 705, is left exposed, and can be removed. During the removal of the portion of the first dielectric layer 125 that covers the second vertical fin 120, the portion of the first dielectric layer 125 covering the first fin remains and is not removed, due to the protection from being enveloped by mask 705.

Figure 8:
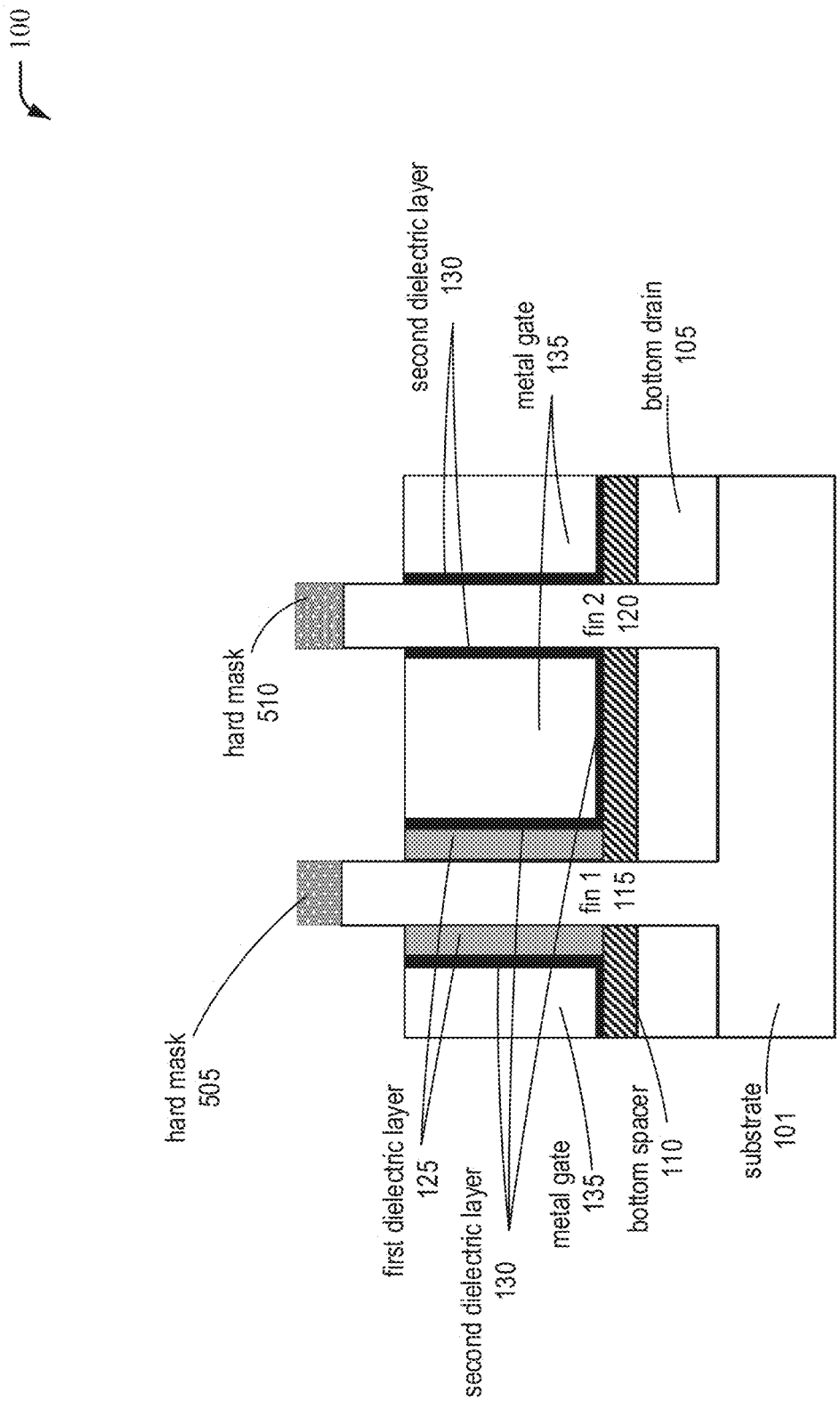
FIG. 8 illustrates a cross-sectional view showing the application of a high dielectric constant layer and metal gate, after stripping of the protective mask, in accordance with one or more embodiments described herein.

FIG. 8 illustrates a cross-sectional view in which the mask 705 has been stripped, and a dielectric layer and metal gate have been added. Subsequent to the mask 705 being stripped away, a second dielectric layer (e.g., second dielectric layer 130) can be formed that covers the first dielectric layer 125 of the first vertical fin 115 and that covers the second fin (e.g., second vertical fin 120). In example embodiments, the thickness of the second dielectric layer 130 can be approximately 2 nanometers. The second dielectric layer can comprise, for example, a high-k dielectric material. High-k dielectric materials are materials that have a high dielectric constant k. For example, silicon dioxide has a dielectric constant k of 3.9. Some examples of high-k dielectrics can be hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. As mentioned above, the gate dielectric of the first vertical transistor of the OTP cell can comprise the first dielectric layer 125 and the second dielectric layer 130 covering the first dielectric layer 125. The gate dielectric of the second vertical transistor can comprise the second dielectric layer 130 covering the second vertical fin 120. After deposition of the second dielectric layer 130, a metal gate (e.g., metal gate 135) can be formed around the first and second fins and their gate dielectrics. Both the second dielectric layer 130 and the metal gate 135 can be formed by, for example, deposition and patterning. As an example, the metal gate 135 can comprise a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), or any suitable combination of these materials. The conductive material may further comprise dopants that are incorporated during or after deposition. In some embodiments, the metal gate can comprise a work function layer. The work function layer can be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

Figure 9:
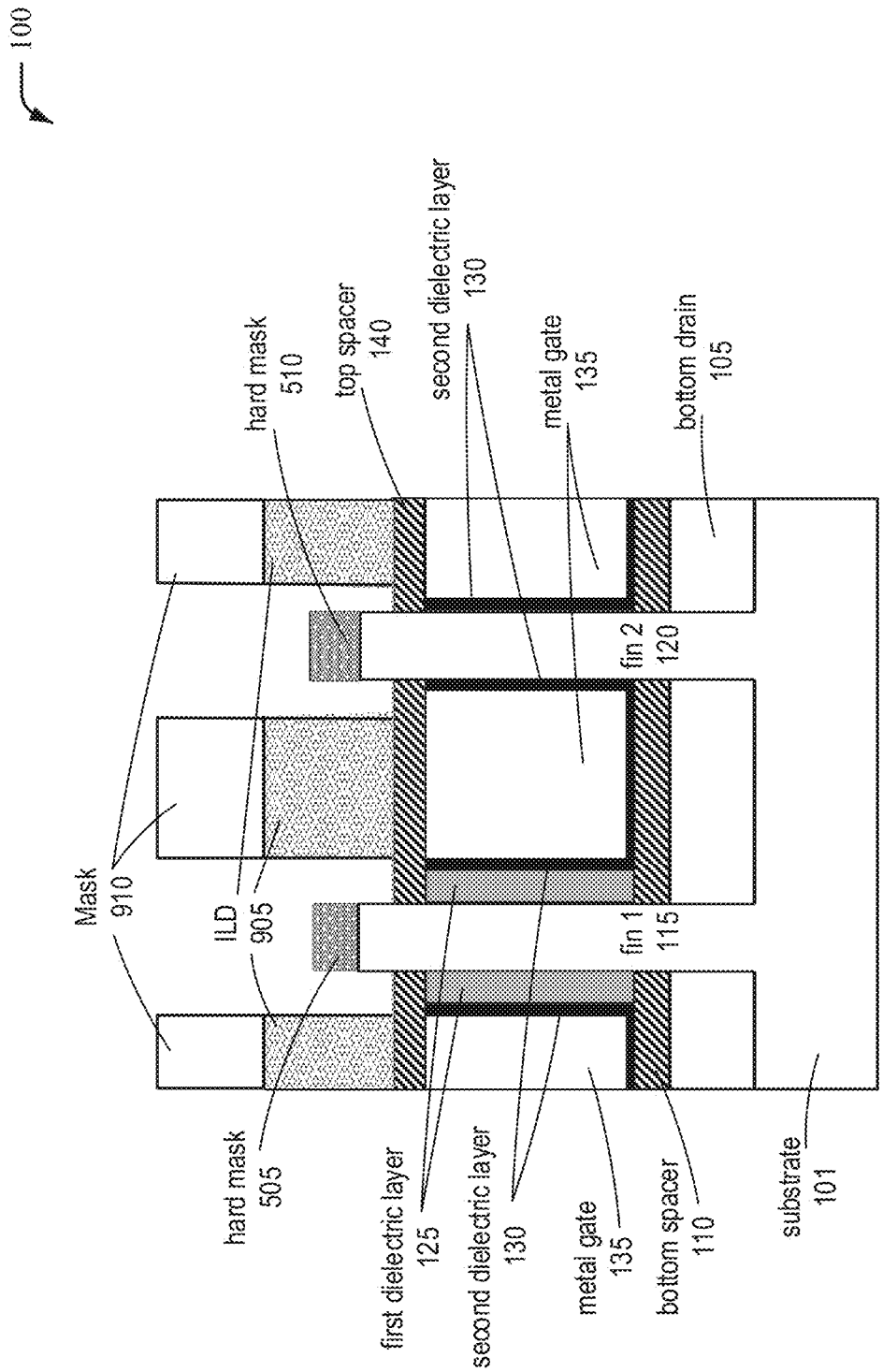
FIG. 9 illustrates a cross-sectional view showing the deposit of a top spacer, interlevel dielectric, and trench patterning above the fins, in accordance with one or more embodiments described herein.

FIG. 9 illustrates another cross-sectional view of a stage of formation of the OTP cell. Here, a top spacer (e.g., top spacer layer 140) can be deposited. The top spacer layer 140 can comprise the same material, or a different material, that was used for the bottom spacer 110. Additionally, an interlevel dielectric (ILD) layer 905 (also referred to as interlayer dielectric) can be deposited on the top spacer, and another mask 910 can be deposited on top of the ILD layer 905. An interlevel dielectric can comprise any dielectric material including, for example, oxides, nitrides or oxynitrides, SiCO, SiOCH, or any suitable combination of those materials. In example embodiments, the ILD layer 905 can comprise silicon dioxide. The ILD layer 905 can be formed, for example, by chemical vapor deposition (CVD), or by spin-coating. In example embodiments, the ILD layer 905 may be self-planarizing, or the top surface of the ILD layer 905 can be planarized by chemical mechanical polishing (CMP).

After the deposit of the top spacer layer 140, ILD layer 905 and mask 910, patterning above the fins can be used to open trenches above the first vertical fin 115 and second vertical fin 120. Planarization techniques, as well as masking and etching techniques, can be used to pattern these trenches.

Figure 10:
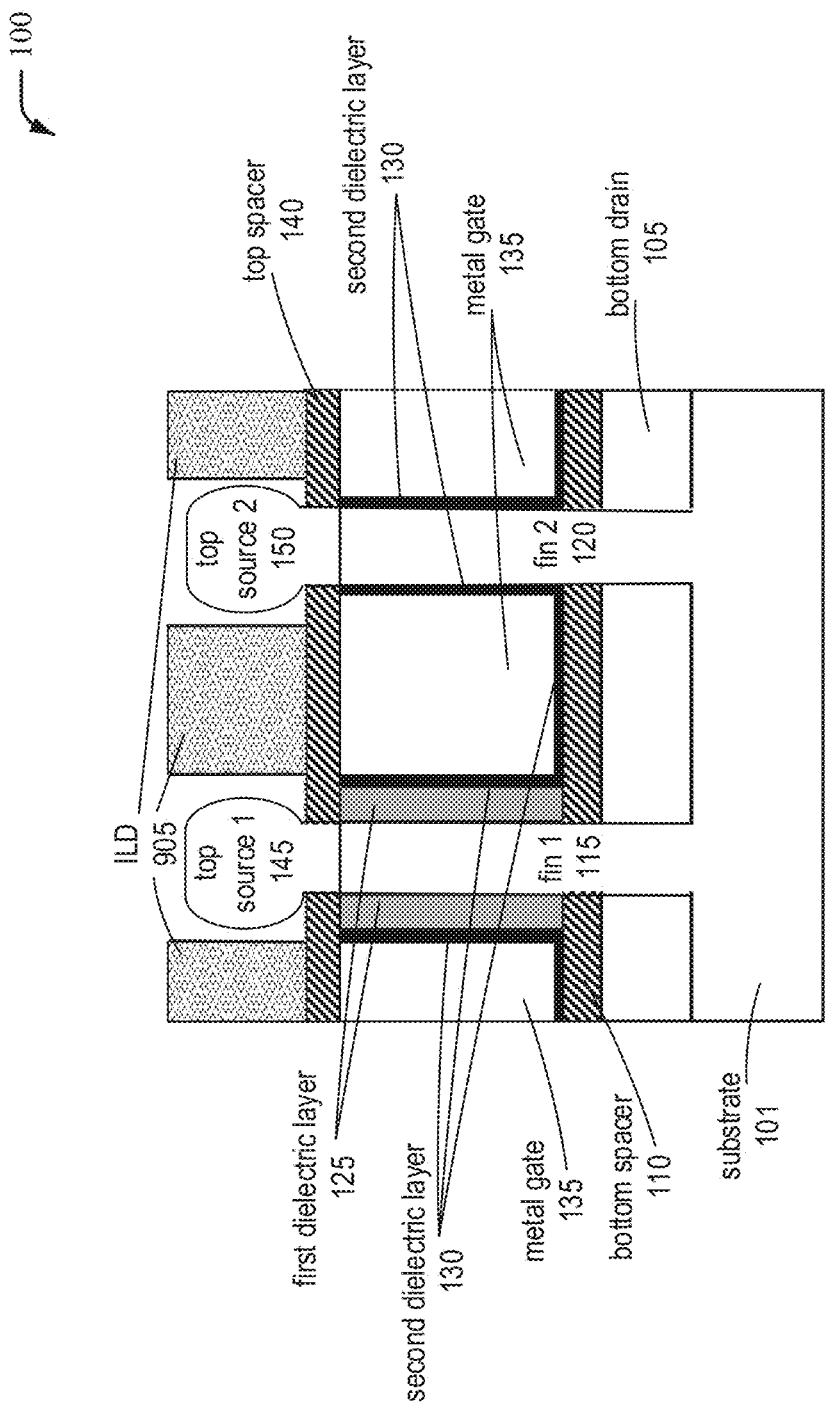
FIG. 10 illustrates a cross-sectional view showing the formation of top sources above the fins, in accordance with one or more embodiments described herein.

FIG. 10 illustrates a cross-sectional view showing the formation of top terminals (e.g., top sources) above the fins, in accordance with one or more embodiments described herein. Here, mask 910 is stripped away, as well as hard masks 505 and 510. Then, top sources (e.g., top source 145, top source 150) are added to the top of the first vertical fin 115 and second vertical fin 120 (e.g., by epitaxy, in-situ doping). Other suitable doping techniques, as described above, can also be used to form top source. In alternative example embodiments, the top source 150 is not formed, as will be described below in FIG. 15. Also, in other embodiments, if the shared bottom terminal comprises a common bottom source, then the top terminal can be referred to as the top drain.

Figure 11:
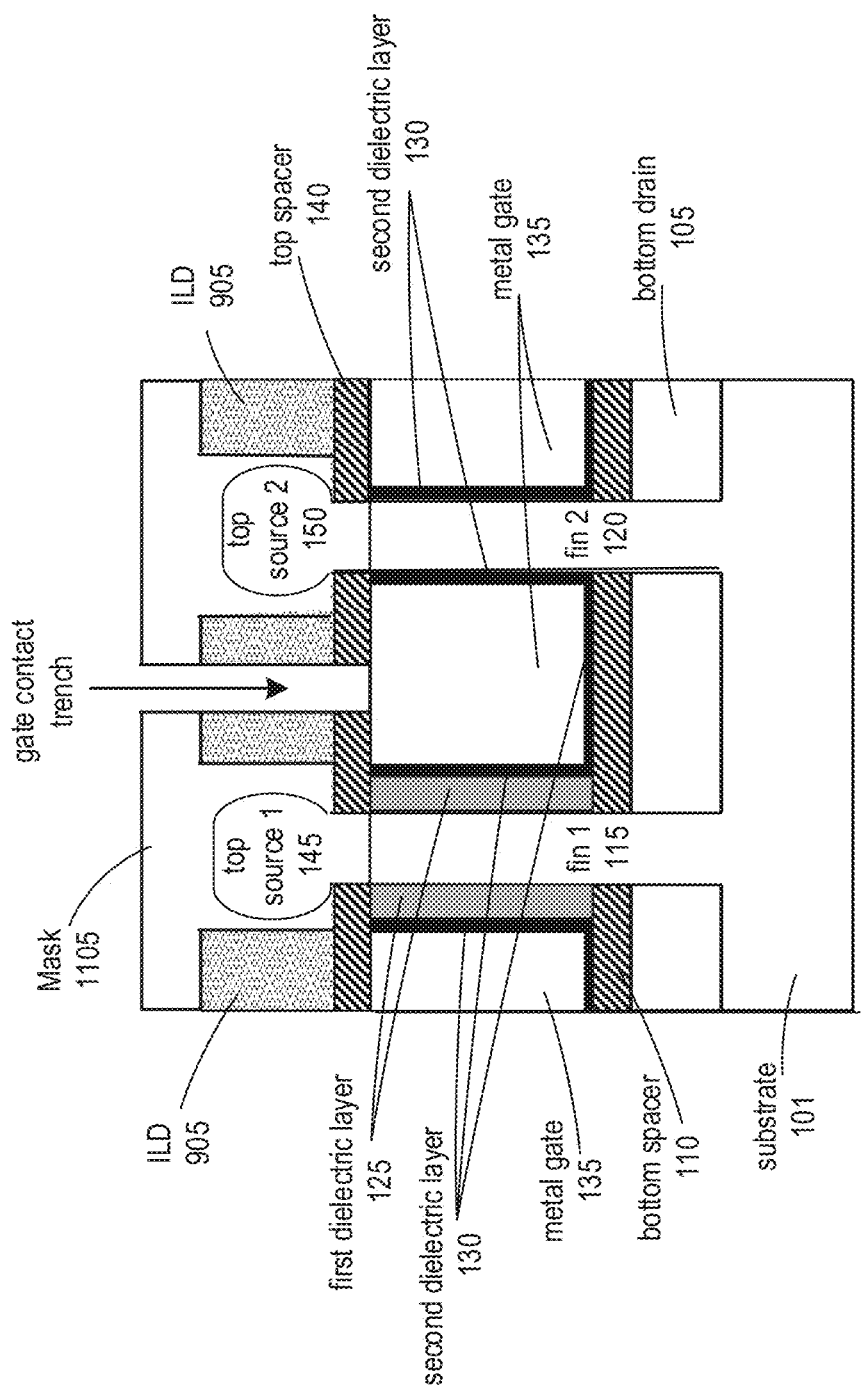
FIG. 11 illustrates a cross-sectional view showing the formation of a trench reaching the metal gate, in accordance with one or more embodiments described herein.

FIG. 11 illustrates a cross-sectional view showing the formation of a trench reaching the metal gate, in accordance with one or more embodiments described herein. Another mask (e.g., another mask 1105) can be deposited in the trench regions created in FIG. 10, above the fins. The mask 1105 can be deposited so as to extend coverage by mask 1105 above the ILD layer 905. After the mask has been applied, a gate contact trench can be formed (e.g., by patterning, or etched using, for example, RIE), wherein the gate trench can be formed all the way to the metal gate 135. This trench will be used to create the gate contact (wordline) when it is later filled with metal(s).

Figure 12:
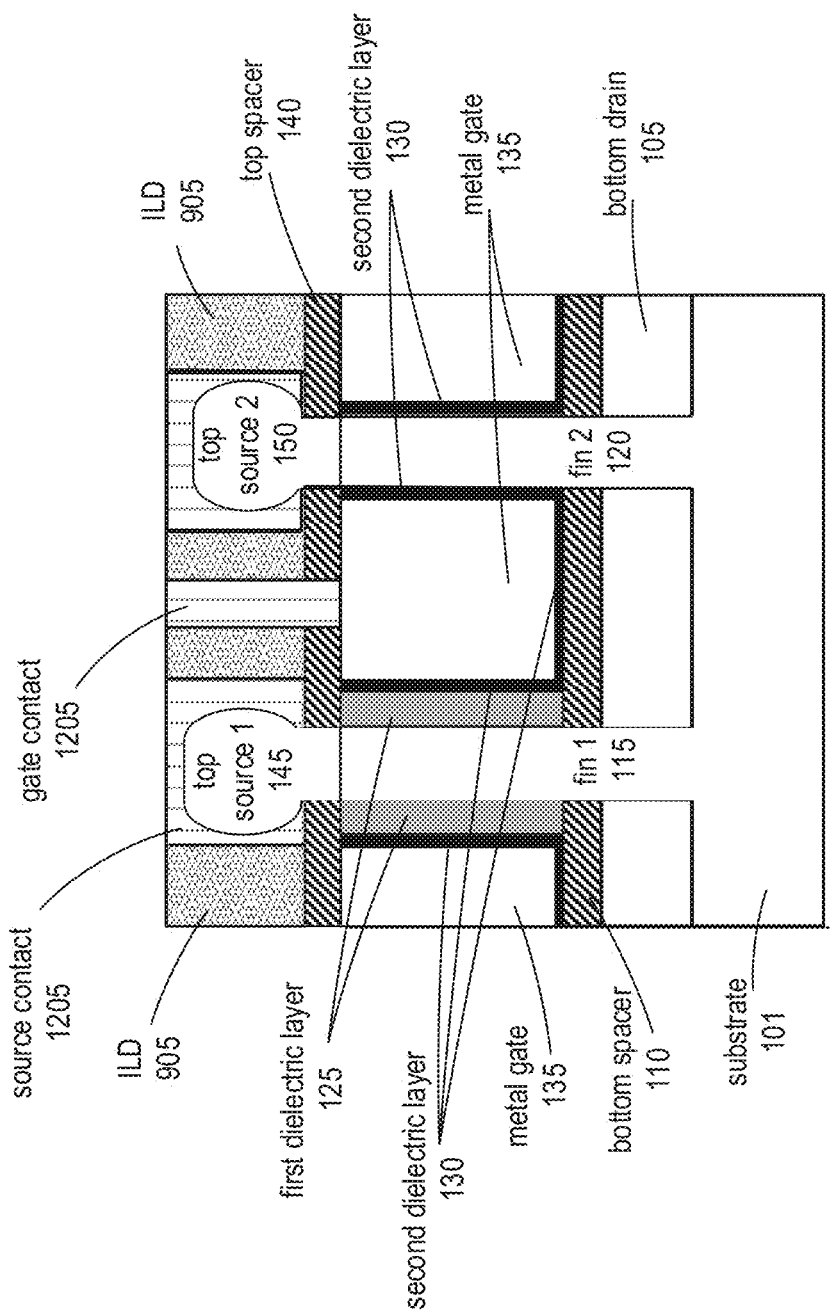
FIG. 12 illustrates a cross-sectional view showing the filling of the trenches above the fins and the trench reaching the metal gate, in accordance with one or more embodiments described herein.

Moving on, FIG. 12 illustrates a cross-sectional view showing the filling of the trenches above the fins and the gate contact trench formed in FIG. 11, in accordance with one or more embodiments described herein. In FIG. 12, the mask 1105 applied as shown in FIG. 11 is removed, leaving trench areas above the fins, and also the gate contact trench region formed in FIG. 11 unfilled. Subsequent to the removal of mask 1105, these trench regions are filled with metals to form contacts (e.g., source contact 1205, gate contact 1210).

Figure 13:
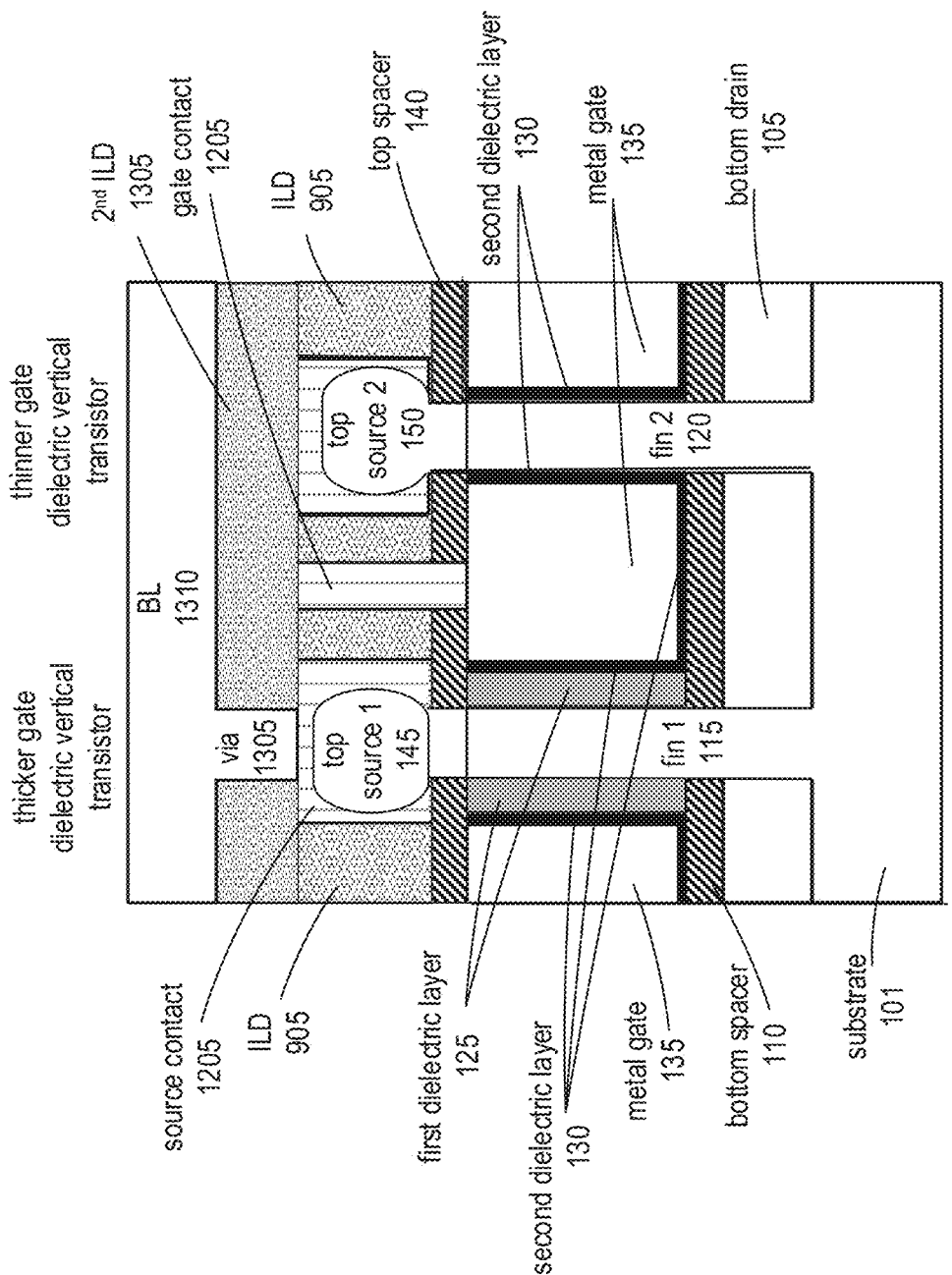
FIG. 13 illustrates a cross-sectional view showing the deposit of a second interlevel dielectric and a bitline, in accordance with one or more embodiments described herein.

FIG. 13 illustrates a cross-sectional view showing the deposit of a second interlevel dielectric and a bitline, in accordance with one or more embodiments described herein. A second interlevel dielectric layer 1305 can be formed on top of the first ILD layer 905. Then, patterning can be used to form (e.g., using a damascene process) a bitline BL that is orthogonal to the wordline WL. The bitline can comprise a "via" 1305 channel above the source contact 1205, and a bitline trench 1310. Both the via 1305 channel and the BL trench 1310 are then filled with conductive material, such as metal, or other conductive material (e.g., polysilicon, silicon-germanium, aluminum, tungsten, copper, titanium, silver, gold, tantalum, etc., or alloys of conductive metals, e.g., Al—Cu, silicides of a conductive metal, e.g., tungsten silicide, and platinum silicide, or other conductive metal compounds such as TiN, TiC, TiSiN, TiTaN, TaN, TaAlN, TaSiN, TaRuN, WSiN, NiSi, CoSi, as well as combinations thereof). The top source 150, although metal is filled around it, is considered floating in that it does not connect to the wordline or bitline.

FIG. 14-19 depict an example process for assembling example embodiments of an OTP cell comprising a first top terminal (e.g., top source 145) above the first fin, but no second top terminal (e.g., top source 150) above the second fin. The first stages of the process for assembly can be similar to those described with respect to FIGS. 5-8. The process can then move to example assembly methods as described below, starting with FIG. 14.

Figure 14:
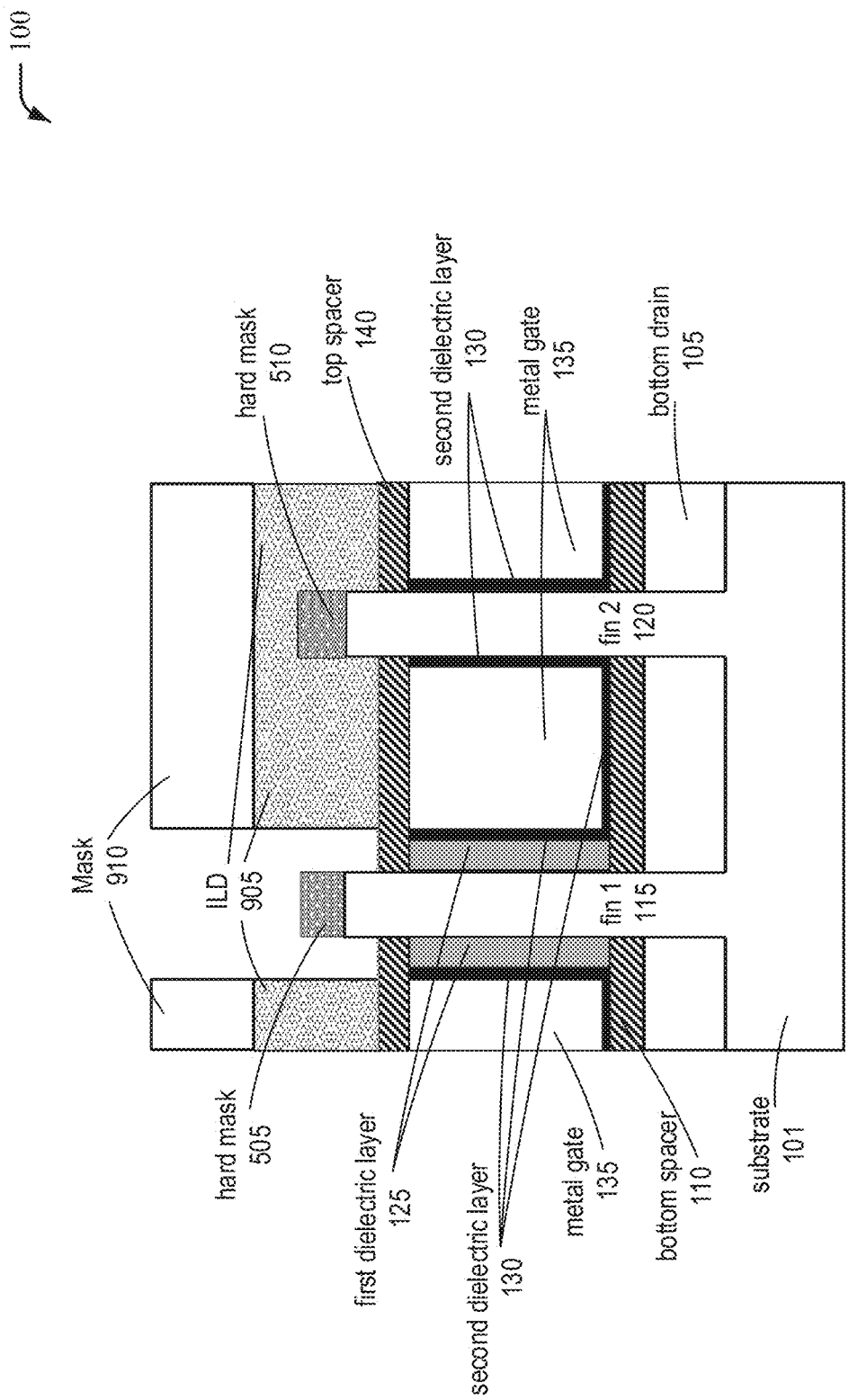
FIG. 14 illustrates a cross sectional view of a patterning to open a trench in the fin top of only the thicker gate dielectric vertical transistor, in accordance with one or more embodiments described herein.

FIG. 14 illustrates a cross sectional view of a patterning to open a trench in the fin top of only the thicker gate dielectric vertical transistor, in accordance with one or more embodiments described herein. This is similar to FIG. 9, except in this example embodiment, a trench above the first vertical fin 115 is opened up, while the area above the second vertical fin 120 is covered by hard mask 510.

Figure 15:
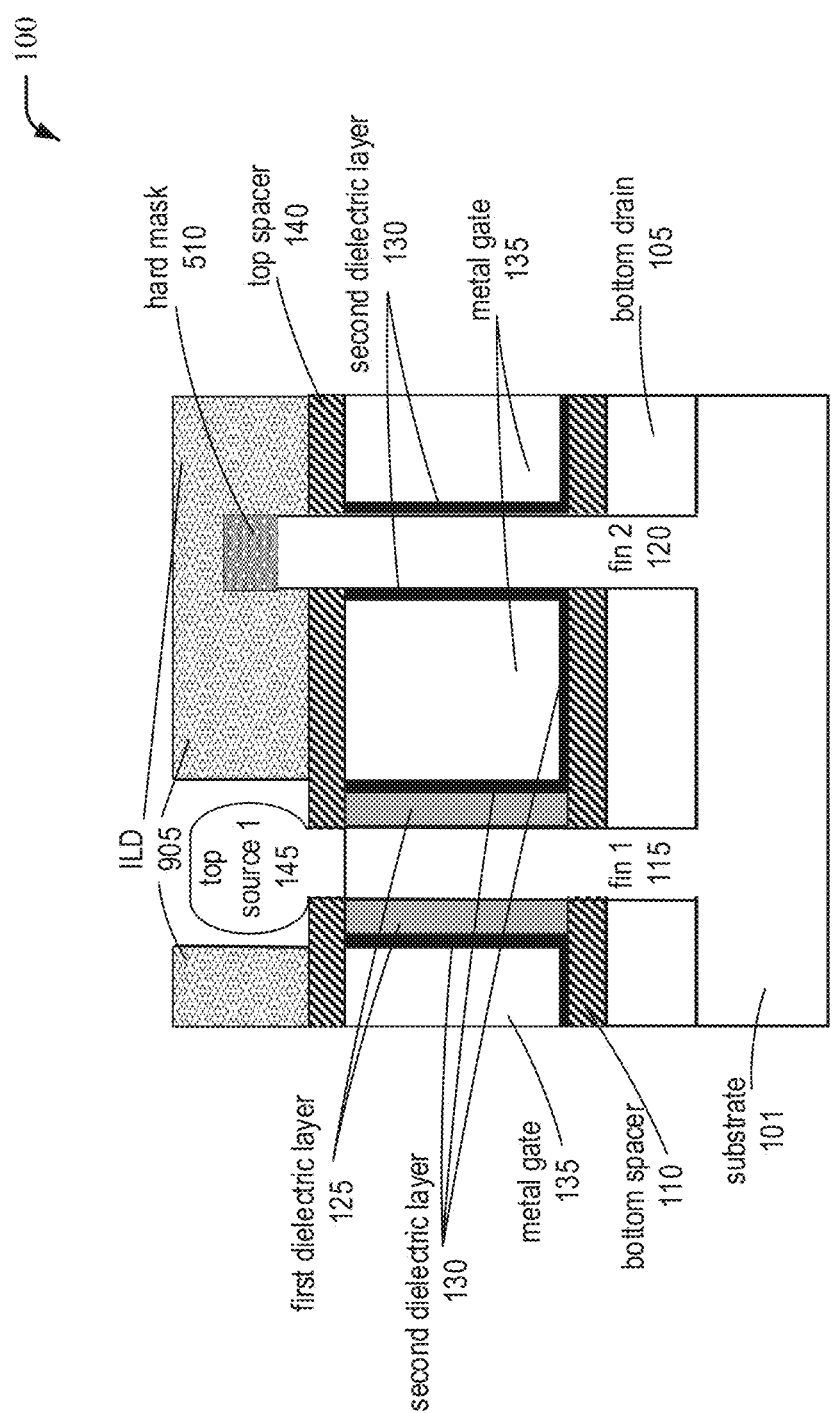
FIG. 15 illustrates a cross sectional view in which the top hard mask is stripped and a top source is formed on top of only the thicker gate dielectric vertical transistor, in accordance with one or more embodiments described herein.

FIG. 15 illustrates a cross sectional view in which the top hard mask (e.g., mask 910) is stripped and a top terminal (e.g., top source 145) is formed on top of only the first vertical fin 115, in accordance with one or more embodiments described herein. FIG. 15 is similar to FIG. 10, except here, the top source (e.g., top source 145) is added to the top of the first vertical fin 115 (e.g., by epitaxy, in-situ doping). As mentioned, if the bottom terminal comprises a bottom source, then this top terminal can be considered the top drain. However, in these example embodiments, a second top terminal (e.g., top source 150) is not formed over the second vertical fin 120, and hard mask 510 remains in place over the top of the second fin, and is remains enclosed by the ILD layer 905.

Figure 16:
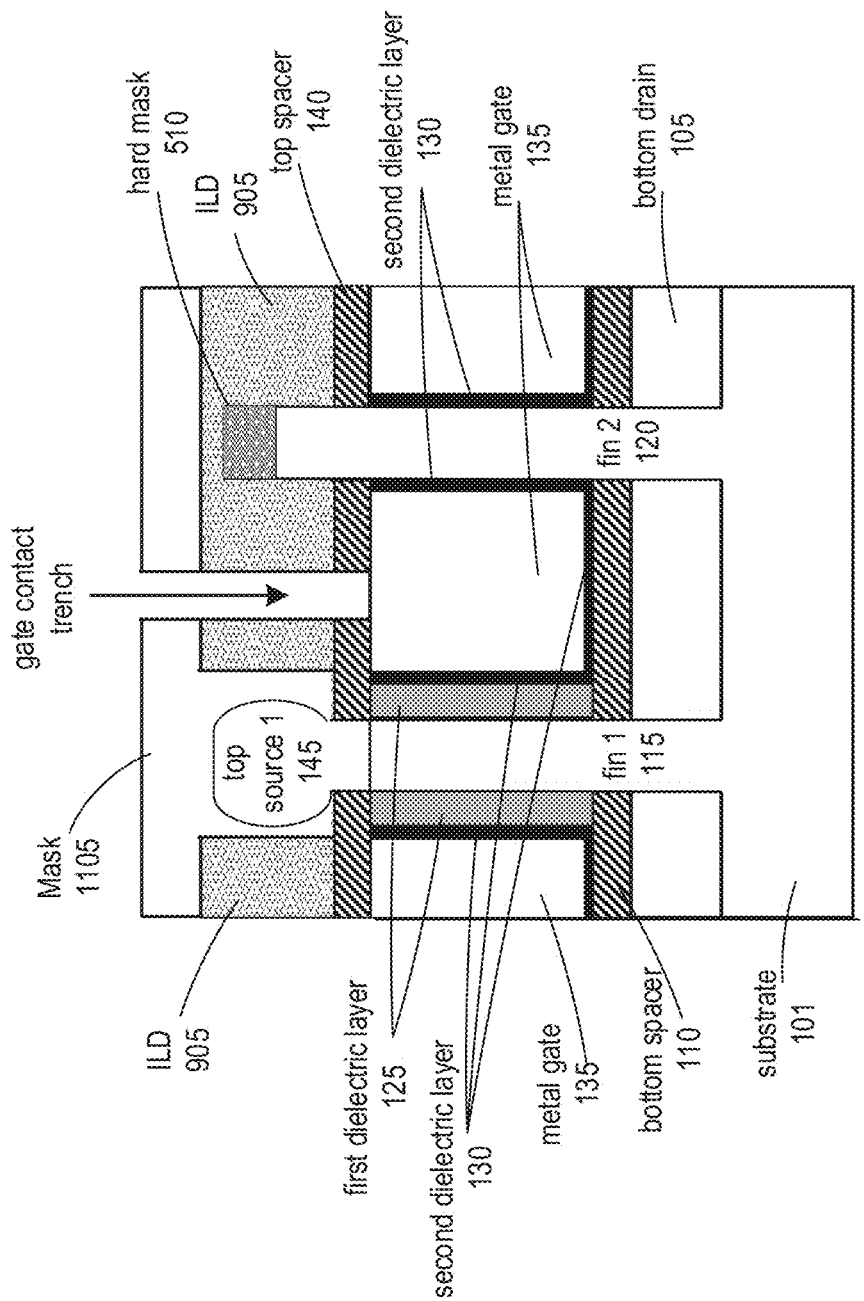
FIG. 16 illustrates a cross-sectional view showing the formation of a trench reaching the metal gate, wherein one vertical transistor has a top source, in accordance with one or more embodiments described herein.

FIG. 16 illustrates a cross-sectional view showing the formation of a gate contact trench reaching the metal gate 135, wherein one vertical transistor has a top terminal, in accordance with one or more embodiments described herein. FIG. 16 is similar to FIG. 11. Another mask (e.g., mask 1105) can be deposited in the trench region created above the first vertical fin 115, but, unlike FIG. 11, there is no trench formed above the second vertical fin 120. Hard mask 510 remains atop the second vertical fin 120. The top of the second vertical fin 120, along with hard mask 51, remains enclosed by ILD layer 905. The mask 1105 can be deposited into the trench above the first vertical fin 115 and around the top source 145, and can further be deposited so as to extend coverage by the mask 1105 above the ILD layer 905. After the mask 1105 has been applied, a gate contact trench can be formed (e.g., by patterning, or by reactive ion etching) reaching to the metal gate 135. This trench is for the gate contact (wordline WL) and will be subsequently filled with metal(s)/

Figure 17:
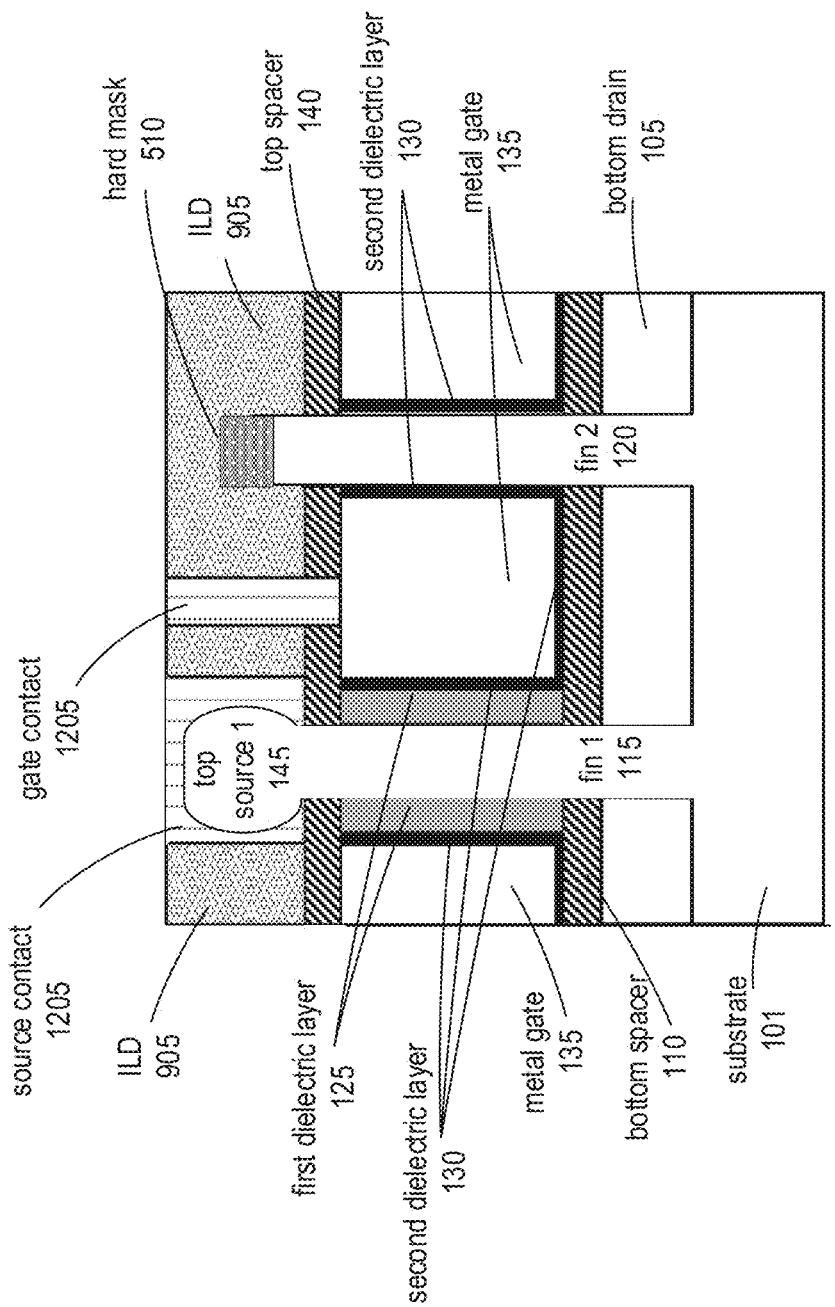
FIG. 17 illustrates a cross-sectional view showing the filling of the trenches above the first fin and the trench reaching the metal gate, in accordance with one or more embodiments described herein.

FIG. 17 illustrates a cross-sectional view showing the filling of the trenches formed in FIG. 16 (e.g., the trenches above the first fin and filling the trench reaching the metal gate 135), in accordance with one or more embodiments described herein. In FIG. 17, the mask 1105 applied as shown in FIG. 16 is removed, leaving unfilled the trench areas above the first vertical fin 115, and also the gate contact trench region formed in FIG. 16. Subsequent to the removal of mask 1105, these unfilled trench regions are then filled with metals to form contacts (e.g., source contact 1205, gate contact 1210). The same metals as described with respect to FIG. 12 above can be used.

Figure 18:
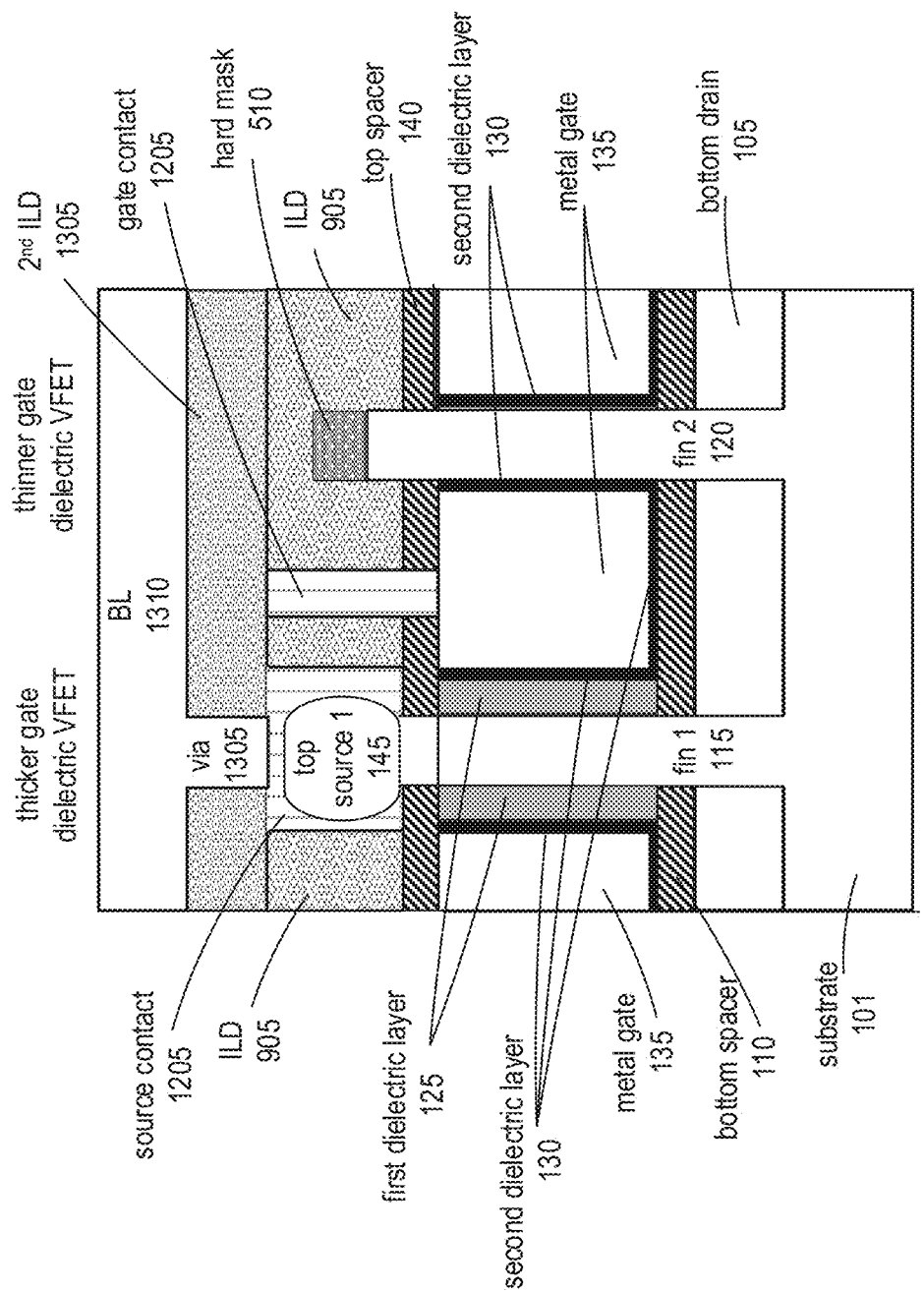
FIG. 18 illustrates a cross-sectional view showing the deposit of a second interlevel dielectric and a bitline, wherein one vertical transistor has a top source, in accordance with one or more embodiments described herein.

FIG. 18 illustrates a cross-sectional view showing the deposit of a second interlevel dielectric and a bitline, wherein one vertical transistor has a top source, in accordance with one or more embodiments described herein. FIG. 18 is similar to FIG. 13, in that a second interlevel dielectric layer 1305 can be formed on top of the ILD layer 905. Then, patterning can be used to form (e.g., using a damascene process) a bitline BL that is orthogonal to the wordline WL. The bitline can comprise a "via" 1305 channel above the source contact 1205 and a bitline trench 1310. Both via 1305 channel and BL trench 1310 are then filled with conductive material, such as metal). Different from the example embodiments of FIG. 13, the example embodiments of FIG. 18 has no top source 150, but instead has a hard mask 510 atop the second vertical fin 120, which remains enclosed by the ILD layer 905. Electrically though, example embodiments of FIG. 18 function similarly to the example embodiments of FIG. 13, in that a breakdown in the second dielectric layer 130 associated with the second vertical fin 120 results in a short (as described in FIGS. 2 and 3).

Figure 19:
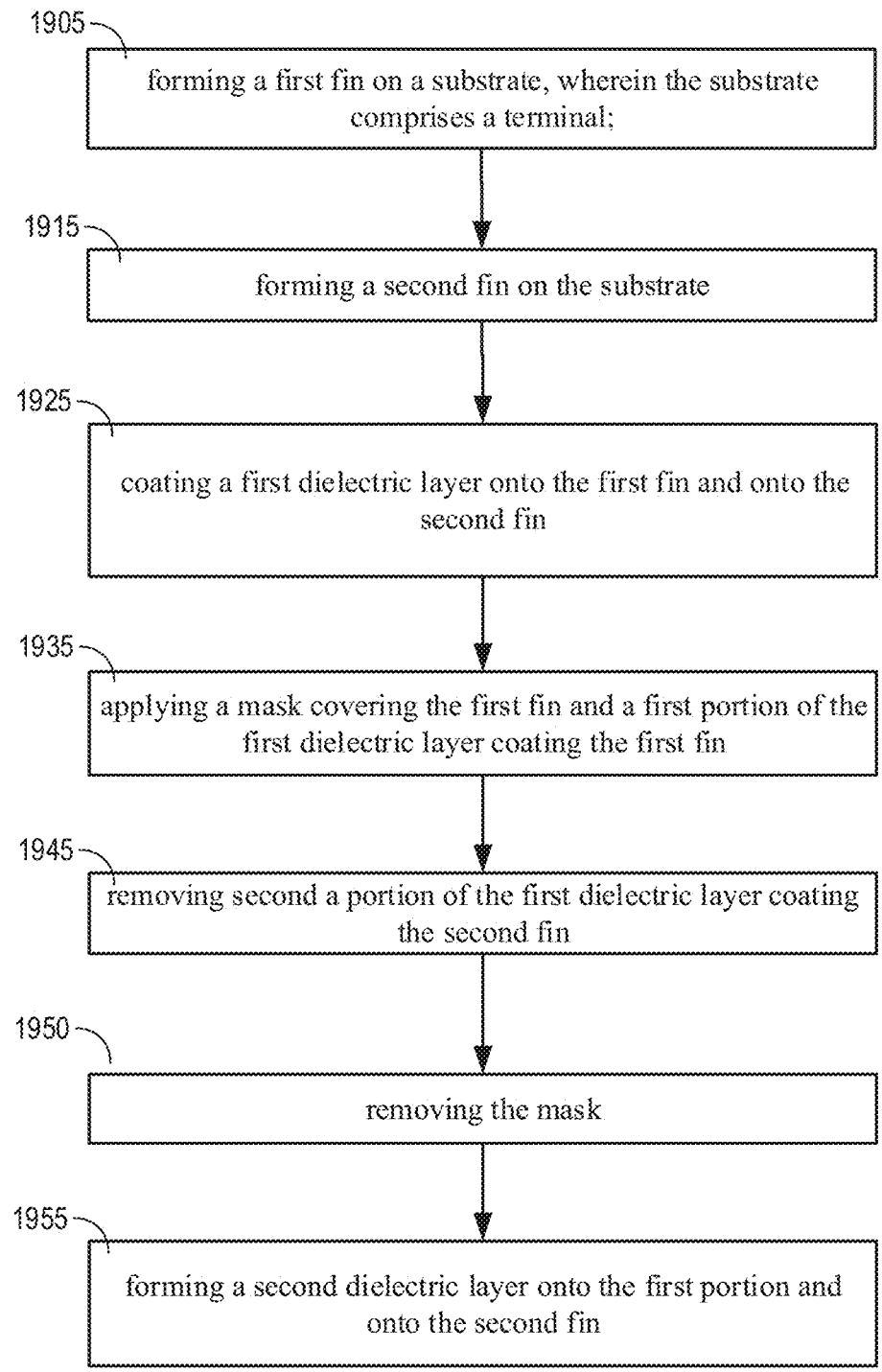
FIG. 19 illustrates a flow diagram of an example, non-limiting method that relates to the assembly of a OTP cell, in accordance with one or more embodiments described herein.

FIG. 19 illustrates a flow diagram 1900 of an example, non-limiting method (e.g., operations) that facilitates assembly of a OTP cell, in accordance with one or more embodiments described herein. In non-limiting example embodiments, a computing device (or system) (e.g., computer 2212) is provided comprising one or more processors and one or more memories that stores executable instructions that, when executed by the one or more processors, can facilitate performance of the operations as described herein, including the non-limiting methods as illustrated in the flow diagram 1900 of FIG. 19, flow diagram 2000 of FIG. 20, and flow diagram 2100 of FIG. 21. As a non-limiting example, the one or more processors can facilitate performance of the methods by directing or controlling one or more equipment operable to perform chip assembly. Various example aspects of these methods have been described above with respect FIGS. 1 through 18, and is also described herein with respect to FIGS. 19, 20, and 21.

The example method 1900 of FIG. 19 can, at 1905, comprise forming a first fin (e.g., first vertical fin 115) on a substrate (e.g., substrate 101), wherein the substrate comprises a terminal (e.g., bottom drain 105). The method can further comprise, at 1915 forming a second fin (e.g., second vertical fin 120) on the substrate. At 1925, the method can further comprise coating a first dielectric layer (e.g., first dielectric layer 125) onto the first fin and onto the second fin. The method can further comprise, at 1935, applying a mask (e.g., mask 705) covering the first fin and a first portion of the first dielectric layer coating the first fin. The operations can further comprise, at 1945, removing a second portion of the first dielectric layer coating the second fin. At 1950, the operations can comprise removing the mask. At 1955, the method can comprise forming a second dielectric layer (second dielectric layer 130) onto the first portion and onto the second fin. The method can further comprise forming a metal gate around the second dielectric layer. The method can further comprise adding a top terminal (e.g., top source) above the first fin. Optionally, the operations can further comprise adding a top terminal above the second fin.

Figure 20:
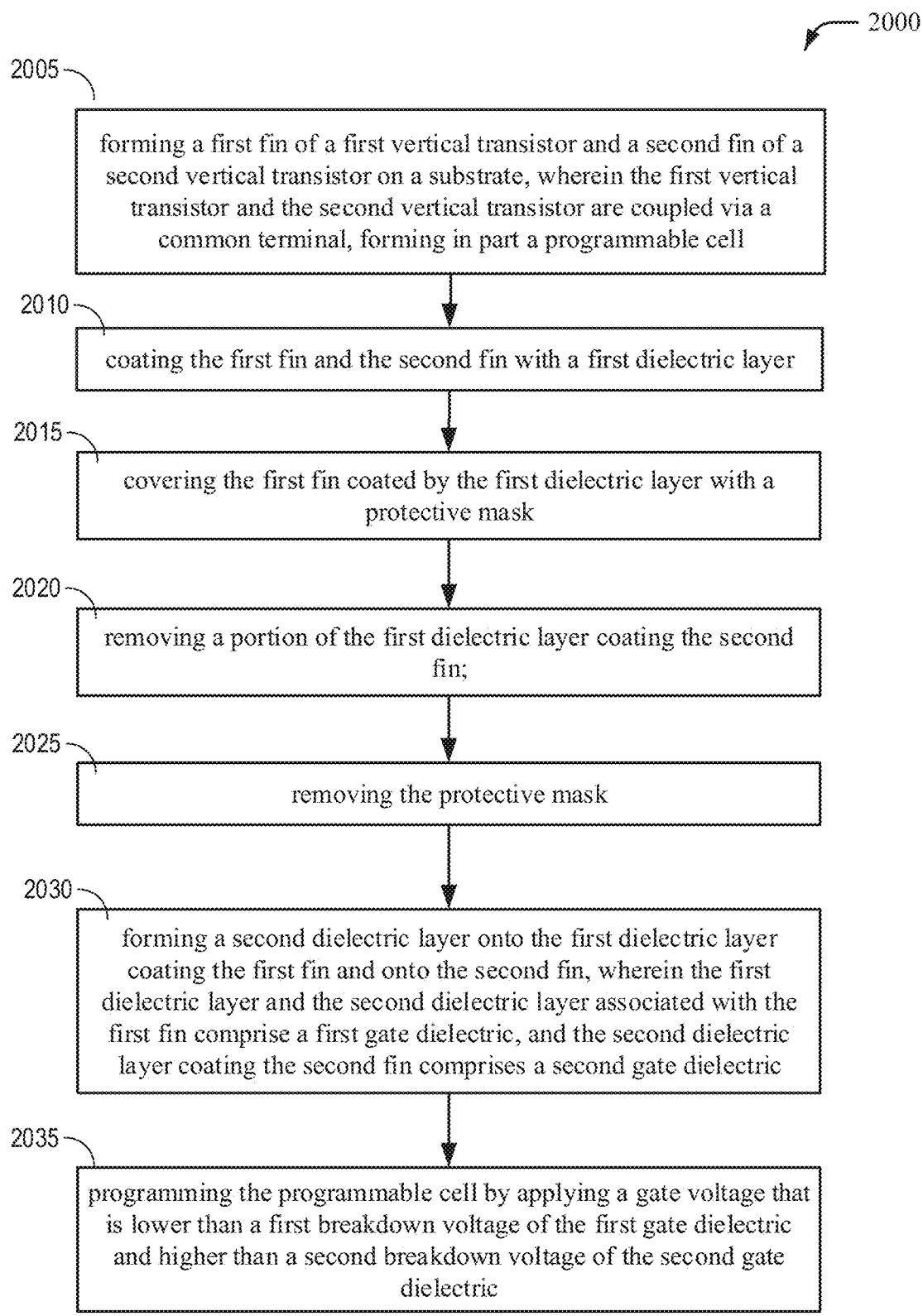
FIG. 20 illustrates a flow diagram of an example, non-limiting method related to the assembly and programming of a OTP cell, in accordance with one or more embodiments described herein.

Moving to FIG. 20, the method 2000 can at 2005 comprise forming a first fin (e.g., first vertical fin 115) of a first vertical transistor (e.g., VFET) and a second fin (e.g., second vertical fin 120) of a second vertical transistor on a substrate (e.g., substrate 101), wherein the first vertical transistor and the second vertical transistor are coupled via a common terminal (e.g., bottom drain 105, or in other example embodiments, a bottom source), forming in part a programmable cell. The method at 2010 can comprise coating the first fin and the second fin with a first dielectric layer (e.g., first dielectric layer 125). The method at 2015 can comprise covering the first fin coated by the first dielectric layer with a protective mask (e.g., mask 705). The method can at 2020 comprise removing a portion of the first dielectric layer coating the second fin. The method can at 2025 comprise removing the protective mask. The method can at 2030, comprise forming a second dielectric layer (second dielectric layer 130) onto the first dielectric layer coating the first fin and onto the second fin, wherein the first dielectric layer and the second dielectric layer associated with the first fin comprise a first gate dielectric, and the second dielectric layer coating the second fin comprises a second gate dielectric. The programmable cell can be selected for programming using a row selection circuit and a column selection circuit. The method can further comprise forming a metal gate (e.g., metal gate 135) in contact with the first gate dielectric and the second gate dielectric. The method can further comprise forming a first top terminal (e.g., top source 145, or in other example embodiments, a top drain) above the first fin. The method can further comprise forming a second top terminal (e.g., top source 150, or in other example embodiments, a top drain) above the second fin. At step 2035, the method can comprise programming the programmable cell by applying a gate voltage that is lower than a first breakdown voltage of the first gate dielectric and higher than a second breakdown voltage of the second gate dielectric.

Figure 21:
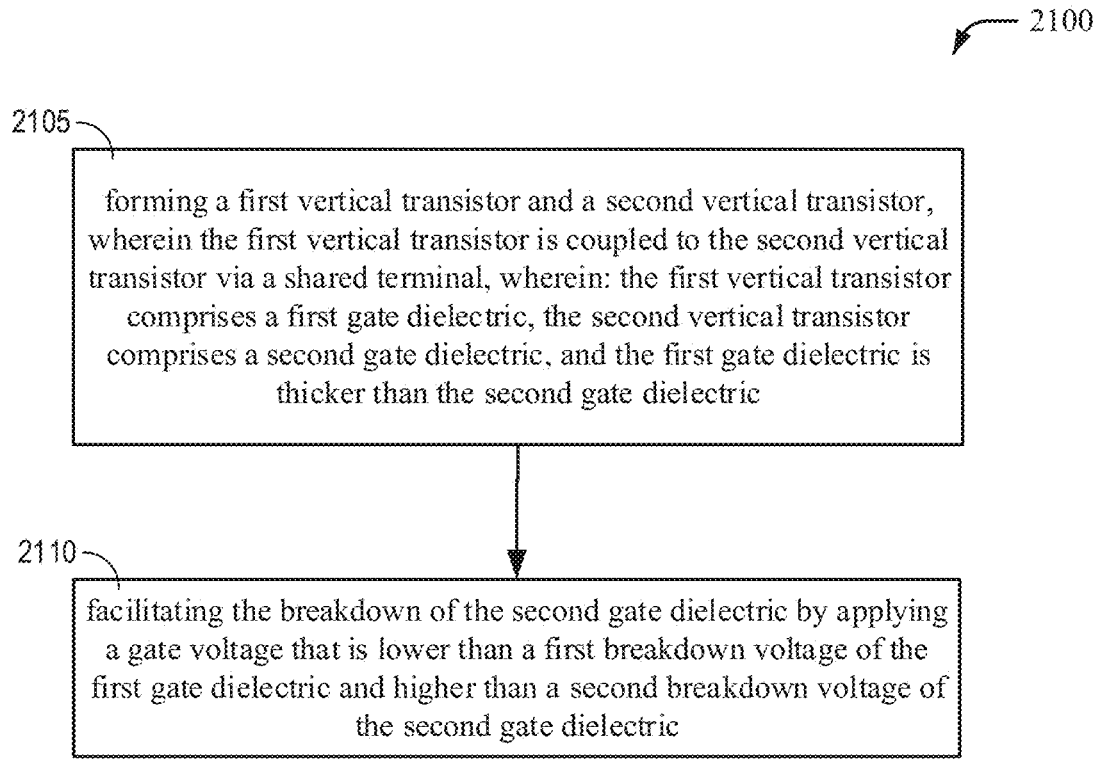
FIG. 21 is another illustration of a flow diagram of an example, non-limiting method relates to the assembly of a OTP cell, in accordance with one or more embodiments described herein.

Now referring to FIG. 21, a method 2100 can at 2105 comprise forming a first vertical transistor (e.g., VFET) and a second vertical transistor, wherein the first vertical transistor is coupled to the second vertical transistor via a shared drain (e.g., bottom drain 105), wherein: the first vertical transistor comprises a first gate dielectric, the second vertical transistor comprises a second gate dielectric, and the first gate dielectric is thicker than the second gate dielectric. The first gate dielectric can comprise a first dielectric layer (e.g., first dielectric layer 125) and a second dielectric layer (e.g., second dielectric layer 130). The second gate dielectric can comprise the second dielectric layer. The method can further comprise forming a metal gate (e.g., metal gate 135) around the dielectric layer. The first vertical transistor can comprise a top source (e.g., top source 145) formed above a first fin (e.g., first vertical fin 115) of the vertical transistor. The second vertical transistor can comprise a top source (e.g., top source 150) formed above a second fin (e.g., second vertical fin 120) of the vertical transistor. The method can, at 2110, comprise facilitating the breakdown of the second gate dielectric by applying a gate voltage that is lower than a first breakdown voltage of the first gate dielectric and higher than a second breakdown voltage of the second gate dielectric.

Figure 22:
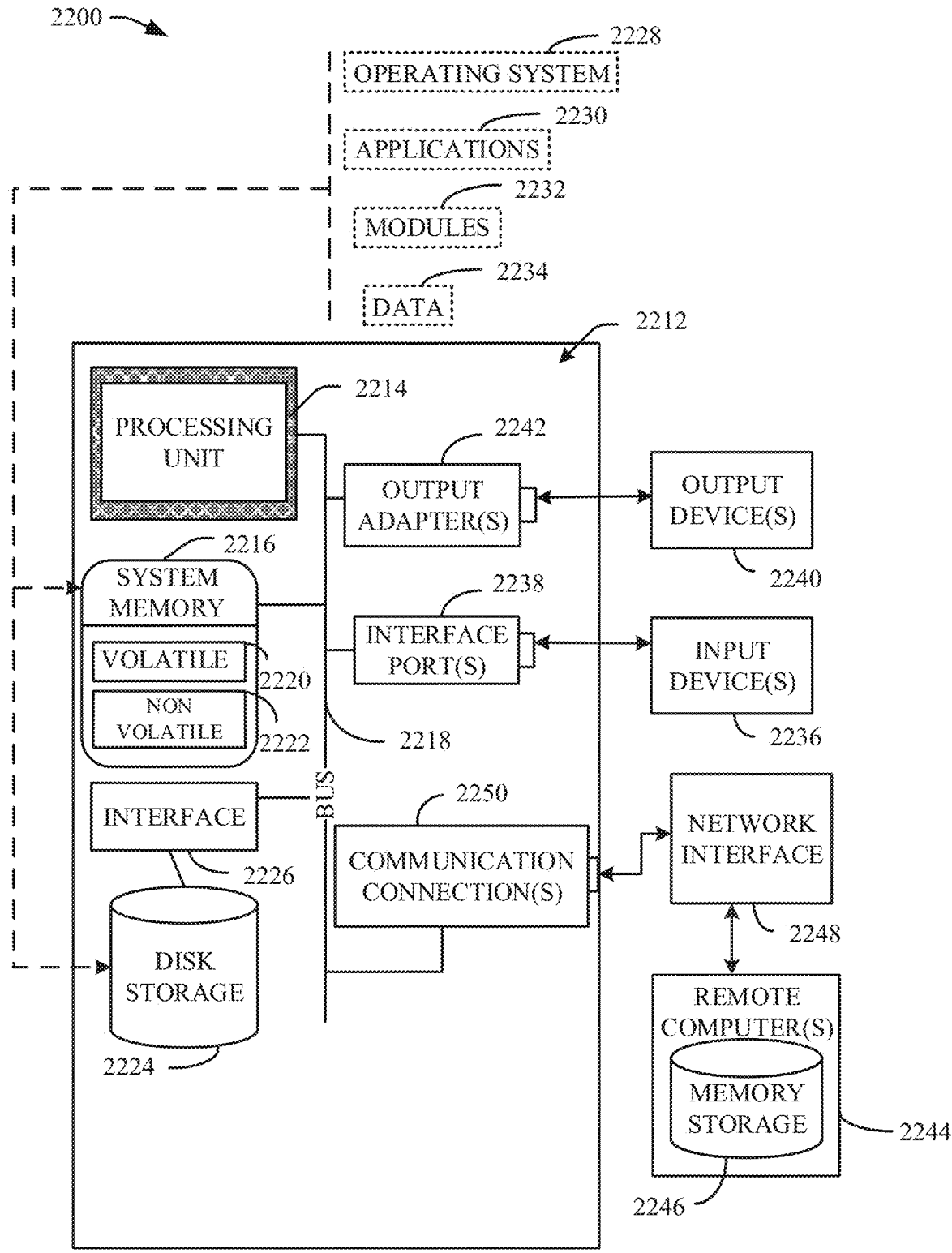
FIG. 22 illustrates a block diagram of an example, non-limiting operating environment in which one or more embodiments described herein can be facilitated.

In order to provide a context for the various aspects of the disclosed subject matter, FIG. 22 as well as the following discussion are intended to provide a general description of a suitable environment in which the various aspects of the disclosed subject matter can be implemented. FIG. 22 illustrates a block diagram of an example, non-limiting operating environment in which one or more embodiments described herein can be facilitated. Repetitive description of like elements employed in other embodiments described herein is omitted for sake of brevity.

With reference to FIG. 22, a suitable operating environment 2200 for implementing various aspects of this disclosure can also include a computer 2212. The computer 2212 can also include a processing unit 2214, a system memory 2216, and a system bus 2218. The system bus 2218 couples system components including, but not limited to, the system memory 2216 to the processing unit 2214. The processing unit 2214 can be any of various available processors. Dual microprocessors and other multiprocessor architectures also can be employed as the processing unit 2214. The system bus 2218 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 2216 can also include volatile memory 2220 and nonvolatile memory 2222. The basic input/output system (BIOS), containing the basic routines to transfer information between elements within the computer 2212, such as during start-up, is stored in nonvolatile memory 2222. Computer 2212 can also include removable/non-removable, volatile/non-volatile computer storage media. FIG. 22 illustrates, for example, a disk storage 2224. Disk storage 2224 can also include, but is not limited to, devices like a magnetic disk drive, floppy disk drive, tape drive, Jaz drive, Zip drive, LS-100 drive, flash memory card, or memory stick. The disk storage 2224 also can include storage media separately or in combination with other storage media. To facilitate connection of the disk storage 2224 to the system bus 2218, a removable or non-removable interface is typically used, such as interface 2226. FIG. 22 also depicts software that acts as an intermediary between users and the basic computer resources described in the suitable operating environment 2200. Such software can also include, for example, an operating system 2228. Operating system 2228, which can be stored on disk storage 2224, acts to control and allocate resources of the computer 2212.

System applications 2230 take advantage of the management of resources by operating system 2228 through program modules 2232 and program data 2234, e.g., stored either in system memory 2216 or on disk storage 2224. It is to be appreciated that this disclosure can be implemented with various operating systems or combinations of operating systems. A user enters commands or information into the computer 2212 through input device(s) 2236. Input devices 2236 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2214 through the system bus 2218 via interface port(s) 2238. Interface port(s) 2238 include, for example, a serial port, a parallel port, a game port, and a universal serial bus (USB). Output device(s) 2240 use some of the same type of ports as input device(s) 2236. Thus, for example, a USB port can be used to provide input to computer 2212, and to output information from computer 2212 to an output device 2240. Output adapter 2242 is provided to illustrate that there are some output devices 2240 like monitors, speakers, and printers, among other output devices 2240, which require special adapters. The output adapters 2242 include, by way of illustration and not limitation, video and sound cards that provide a means of connection between the output device 2240 and the system bus 2218. It should be noted that other devices and/or systems of devices provide both input and output capabilities such as remote computer(s) 2244.

Computer 2212 can operate in a networked environment using logical connections to one or more remote computers, such as remote computer(s) 2244. The remote computer(s) 2244 can be a computer, a server, a router, a network PC, a workstation, a microprocessor based appliance, a peer device or other common network node and the like, and typically can also include many or all of the elements described relative to computer 2212. For purposes of brevity, only a memory storage device 2246 is illustrated with remote computer(s) 2244. Remote computer(s) 2244 is logically connected to computer 2212 through a network interface 2248 and then physically connected via communication connection 2250. Network interface 2248 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 2250 refers to the hardware/software employed to connect the network interface 2248 to the system bus 2218. While communication connection 2250 is shown for illustrative clarity inside computer 2212, it can also be external to computer 2212. The hardware/software for connection to the network interface 2248 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The description of the various embodiments of the present invention have been presented for purpose of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

Further, what has been described above include mere examples of devices and methods. It is, of course, not possible to describe every conceivable combination of components or methods for purposes of describing this disclosure, but one of ordinary skill in the art can recognize that many further combinations and permutations of this disclosure are possible. Furthermore, to the extent that the terms "include," "have," "possess," and the like are used in the detailed description, claims, appendices and drawings such terms are intended to be inclusive in a manner similar to the term "comprising" as "comprising" is interpreted when employed as a transitional word in a claim.

What is claimed is:

1. A programmable device comprising:
   a first vertical transistor; and
   a second vertical transistor coupled to the first vertical transistor via a shared terminal comprising a shared bottom source, wherein:
   a first gate dielectric of the first vertical transistor has a first thickness and a second gate dielectric of the second vertical transistor has a second thickness, the first thickness being greater than the second thickness, and
   the second gate dielectric breaks down based on an application of a gate voltage that is lower than a first breakdown voltage of the first gate dielectric and higher than a second breakdown voltage of the second gate dielectric, wherein the first vertical transistor comprises a first fin coupled to the first gate dielectric, and wherein the second vertical transistor comprises a second fin coupled to the second gate dielectric.

2. The programmable device of claim 1, wherein the first gate dielectric comprises a first dielectric layer and a second dielectric layer.

3. The programmable device of claim 1, wherein the first vertical transistor further comprises a top terminal situated above the first fin.

4. The programmable device of claim 1, wherein the first vertical transistor comprises a first top terminal situated above the first fin, and the second vertical transistor comprises a second top terminal situated above the second fin.

5. The programmable device of claim 1, further comprising a metal gate in contact with the first gate dielectric and the second gate dielectric.

6. A method, comprising:
   forming a first fin of a first vertical transistor and a second fin of a second vertical transistor on a substrate, wherein the first vertical transistor and the second vertical transistor are coupled via a common terminal, forming, in part, a programmable cell;
   coating the first fin and the second fin with a first dielectric layer and covering the first fin coated by the first dielectric layer with a protective mask;
   removing a portion of first dielectric layer coating the second fin and removing the protective mask;
   forming a second dielectric layer onto the first dielectric layer coating the first fin and onto the second fin, wherein the first dielectric layer and the second dielectric layer associated with the first fin comprise a first gate dielectric, and the second dielectric layer coating the second fin comprises a second gate dielectric; and
   programming the programmable cell by applying a gate voltage that is lower than a first breakdown voltage of the first gate dielectric and higher than a second breakdown voltage of the second gate dielectric.

7. The method of claim 6, wherein the programmable cell can be selected for programming using a row selection circuit and a column selection circuit.

8. The method of claim 6, further comprising forming a first top terminal above the first fin.

9. The method of claim 6, further comprising forming a metal gate in contact with the first gate dielectric and the second gate dielectric.

10. The method of claim 6, wherein the common terminal comprises a drain.

11. The method of claim 10, wherein the common terminal comprises a source.

12. A method, comprising:
forming a first vertical transistor and a second vertical transistor, wherein the first vertical transistor is coupled to the second vertical transistor via a shared terminal, and wherein:
the first vertical transistor comprises a first gate dielectric and comprises a top terminal formed above a first fin of the first vertical transistor,
the second vertical transistor comprises a second gate dielectric, and
the first gate dielectric is thicker than the second gate dielectric; and
facilitating the breakdown of the second gate dielectric by applying a gate voltage that is lower than a first breakdown voltage of the first gate dielectric and higher than a second breakdown voltage of the second gate dielectric.

13. The method of claim 12, wherein the second vertical transistor comprises a top terminal formed above a second fin of the second vertical transistor.

14. The method of claim 12, wherein the first gate dielectric comprises a first dielectric layer and a second dielectric layer.

15. The method of claim 14, wherein the second gate dielectric comprises the second dielectric layer.

16. The method of claim 14, further comprising forming a metal gate around the second dielectric layer.

* * * * *